(12) United States Patent
Kim et al.

(10) Patent No.: US 11,322,614 B2
(45) Date of Patent: May 3, 2022

(54) SEMICONDUCTOR DEVICE

(71) Applicant: SAMSUNG ELECTRONICS CO., LTD., Suwon-si (KR)

(72) Inventors: Hyo Jin Kim, Hwaseong-si (KR);
Dong Woo Kim, Incheon (KR); Sang Moon Lee, Suwon-si (KR); Seung Hun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/934,240

(22) Filed: Jul. 21, 2020

(65) Prior Publication Data

US 2021/0111281 A1    Apr. 15, 2021

(30) Foreign Application Priority Data

Oct. 14, 2019    (KR) .......................... 10-2019-0126663

(51) Int. Cl.
*H01L 29/78*        (2006.01)
*H01L 21/768*      (2006.01)
(Continued)

(52) U.S. Cl.
CPC .... *H01L 29/7848* (2013.01); *H01L 21/76829* (2013.01); *H01L 21/823821* (2013.01); *H01L 27/0924* (2013.01); *H01L 29/7851* (2013.01); *H01L 29/78696* (2013.01); *H01L 29/0653* (2013.01)

(58) Field of Classification Search
CPC ..... H01L 21/823418; H01L 21/823431; H01L 21/823814; H01L 21/823821; H01L 21/845; H01L 27/0886; H01L 27/0924; H01L 27/10879; H01L 27/1211; H01L 29/0843; H01L 29/41791; H01L 29/66636; H01L 29/66795; H01L 29/7848;
(Continued)

(56) References Cited

U.S. PATENT DOCUMENTS 9,472,620 B1    10/2016    Wang et al.
9,633,891 B2    4/2017     Collaert et al.
(Continued)

FOREIGN PATENT DOCUMENTS

WO    2018057043    3/2018

*Primary Examiner* — David C Spalla
(74) *Attorney, Agent, or Firm* — F. Chau & Associates, LLC

(57) ABSTRACT

A semiconductor device includes first and second fin-shaped patterns disposed on a substrate and extending in a first direction, first and second channel layers disposed on the first and second fin-shaped patterns, first and second etch stop layers disposed inside the first and second channel layers, first and second gate structures extending in a second direction different from the first direction on the first channel layer with a first recess formed therebetween, third and fourth gate structures extending in the second direction on the second channel layer with a second recess formed therebetween, the first recess having a first width in the first direction and having a first depth in a third direction perpendicular to the first and second directions, the second recess having a second width different from the first width in the first direction, and having a second depth equal to the first depth in the third direction.

19 Claims, 30 Drawing Sheets

(51) Int. Cl.
*H01L 21/8238* (2006.01)
*H01L 27/092* (2006.01)
*H01L 29/06* (2006.01)
*H01L 29/786* (2006.01)

(58) Field of Classification Search
CPC .............. H01L 29/785; H01L 29/7851; H01L 29/7853; H01L 29/7855; H01L 2029/7858
See application file for complete search history.

(56) References Cited

U.S. PATENT DOCUMENTS

| | | |
|---|---|---|
| 9,722,079 B2 | 8/2017 | Chang et al. |
| 9,761,722 B1 | 9/2017 | Jagannathan et al. |
| 9,786,783 B2 | 10/2017 | Hafez et al. |
| 9,923,094 B2 | 3/2018 | Ching et al. |
| 9,954,077 B2 | 4/2018 | Vellianitis |
| 10,121,875 B1* | 11/2018 | Ho .................. H01L 23/5283 |
| 2015/0162436 A1* | 6/2015 | Toh .................. H01L 21/76205 257/401 |
| 2017/0110579 A1* | 4/2017 | Chang ............... H01L 29/66537 |
| 2018/0277534 A1* | 9/2018 | Huang .............. H01L 29/66795 |
| 2019/0067125 A1 | 2/2019 | Chiang et al. |
| 2019/0115259 A1* | 4/2019 | Yeh .................. H01L 21/26586 |
| 2020/0403099 A1* | 12/2020 | Cheng ................ H01L 29/0847 |

* cited by examiner

US 11,322,614 B2

SEMICONDUCTOR DEVICE

CROSS-REFERENCE TO RELATED APPLICATION

This application claims priority under 35 U.S.C. § 119 to Korean Patent Application No. 10-2019-0126663, filed on Oct. 14, 2019, in the Korean Intellectual Property Office, the contents of which are herein incorporated by reference in their entirety.

TECHNICAL FIELD

The present disclosure relates to a semiconductor device.

DISCUSSION OF RELATED ART

To increase the density of semiconductor devices, a multi-gate transistor has been proposed as one of the scaling techniques, in which a fin- or nanowire-shaped multi-channel active pattern (or silicon body) is formed on a substrate and a gate is formed on the surface of the multi-channel active pattern.

Since the multi-gate transistor uses a three-dimensional (3D) channel, scaling of the multi-gate transistor can be easily achieved. Further, current control capability can be enhanced without increasing the gate length of the multi-gate transistor. In addition, a short channel effect (SCE) in which the potential of a channel region is affected by a drain voltage can be effectively suppressed.

Besides scaling, to extend these semiconductor devices for multiple technology nodes, there is a need to boost the performance with high mobility channels. Thus, silicon germanium (SiGe) fin field effect transistors (FinFET) or silicon germanium (SiGe) multi-gate transistors having higher channel mobility compared to their silicon counterparts have been proposed. Since etching silicon germanium (SiGe) fin is relatively difficult to control due to different germanium (Ge) concentration, variations in the etched recess depths for the source/drain regions may occur resulting in deteriorating the performance of the semiconductor devise. Therefore, silicon germanium (SiGe) fin field effect transistors (FinFET) or silicon germanium (SiGe) multi-gate transistors with source/drain regions having a uniform depth may be desirable.

SUMMARY

Aspects of the present disclosure provide a semiconductor device in which an etch stop layer is formed inside a channel layer to adjust a depth of a source/drain region, thereby enhancing loading between elements and enhancing distribution of source/drain regions.

According to an exemplary embodiment of the present disclosure, a semiconductor device includes first and second fin-shaped patterns disposed on a substrate and extending in a first direction, a first channel layer disposed on the first fin-shaped pattern, a second channel layer disposed on the second fin-shaped pattern, a first etch stop layer disposed inside the first channel layer, a second etch stop layer disposed inside the second channel layer, first and second gate structures extending in a second direction different from the first direction on the first channel layer, third and fourth gate structures extending in the second direction on the second channel layer, a first recess formed between the first gate structure and the second gate structure, the first recess having a first width in the first direction and having a first depth in a third direction perpendicular to the first and second directions, and a second recess formed between the third gate structure and the fourth gate structure, the second recess having a second width in the first direction and having a second depth in the third direction. The second width is different from the first width, and the second depth is equal to the first depth.

According to an exemplary embodiment of the present disclosure, a semiconductor device includes a substrate including a first PMOS region and a second PMOS region, a first fin-shaped pattern disposed on the first PMOS region and extending in a first direction, a second fin-shaped pattern disposed on the second PMOS region and extending in the first direction, a first gate structure disposed on the first fin-shaped pattern and extending in a second direction different from the first direction, a second gate structure disposed on the second fin-shaped pattern and extending in the second direction, a first recess formed on at least one side of the first gate structure, the first recess having a first width in the first direction and having a first depth in a third direction perpendicular to the first and second directions, and a second recess formed on at least one side of the second gate structure, the second recess having a second width in the first direction and having a second depth in the third direction. The second width is different from the first width, and the second depth is equal to the first depth.

According to an exemplary embodiment of the present disclosure, a semiconductor device includes a substrate including a first PMOS region and a second PMOS region, a first fin-shaped pattern disposed on the first PMOS region and extending in a first direction, a second fin-shaped pattern disposed on the second PMOS region and extending in the first direction, a first channel layer disposed on the first fin-shaped pattern and including silicon germanium (SiGe), a second channel layer disposed on the second fin-shaped pattern and including silicon germanium (SiGe), a first etch stop layer disposed inside the first channel layer and including silicon (Si), silicon germanium (SiGe), or both silicon (Si) and silicon germanium (SiGe), a second etch stop layer disposed inside the second channel layer and including silicon (Si), silicon germanium (SiGe), or both silicon (Si) and silicon germanium (SiGe), first and second gate structures extending in a second direction different from the first direction on the first channel layer, third and fourth gate structures extending in the second direction on the second channel layer, a first recess formed between the first gate structure and the second gate structure, the first recess having a first width in the first direction and having a first depth in a third direction perpendicular to the first and second directions, a second recess formed between the third gate structure and the fourth gate structure, the second recess having a second width in the first direction and having a second depth in the third direction, a first source/drain region disposed inside the first recess, and a second source/drain region disposed inside the second recess. The second width is different from the first width, and the second depth is equal to the first depth.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the accompanying drawings, in which.

Figure 1:
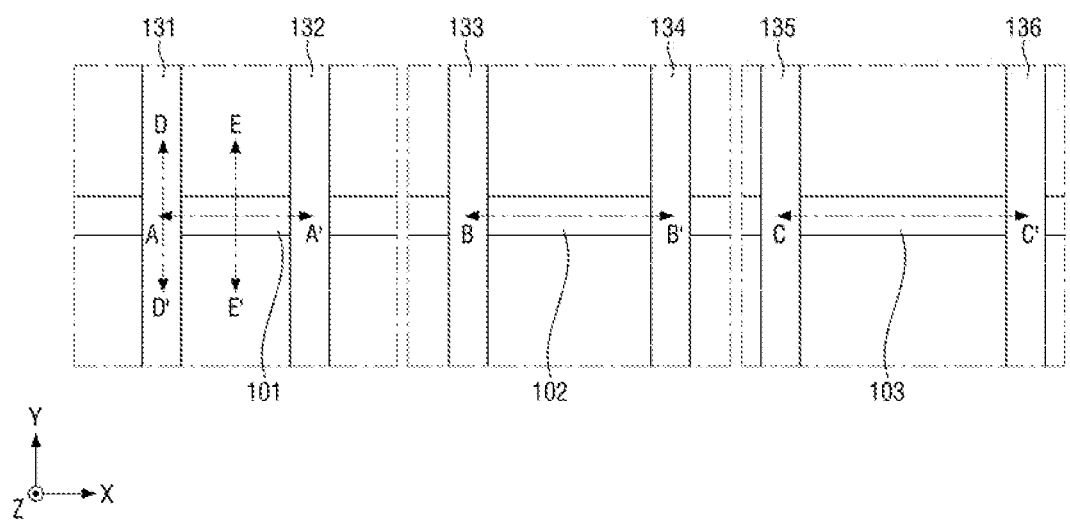
FIG. 1 is a schematic plan view illustrating a semiconductor device according to an exemplary embodiment of the present disclosure.

Since the drawings in FIGS. 1-30 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, a semiconductor device according to an exemplary embodiment of the present disclosure will be described with reference to FIGS. 1 to 7.

Figure 2:
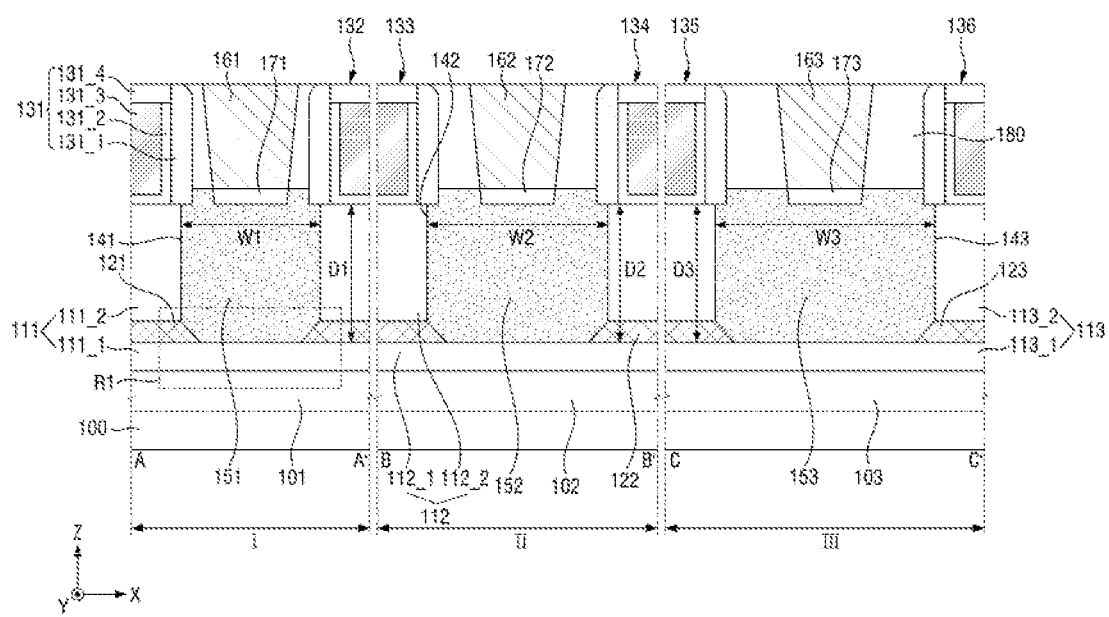
FIG. 2 is a cross-sectional view taken along lines A-A', B-B' and C-C' of FIG. 1.
Figure 3:
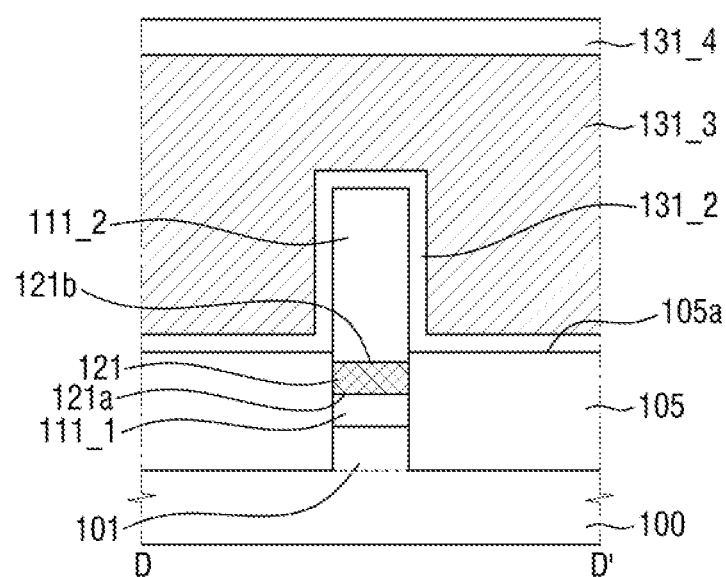
FIGS. 3 and 5 are cross-sectional views taken along line D-D' of FIG. 1.
Figure 3:
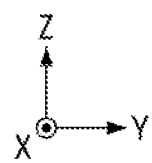
Figure 4:
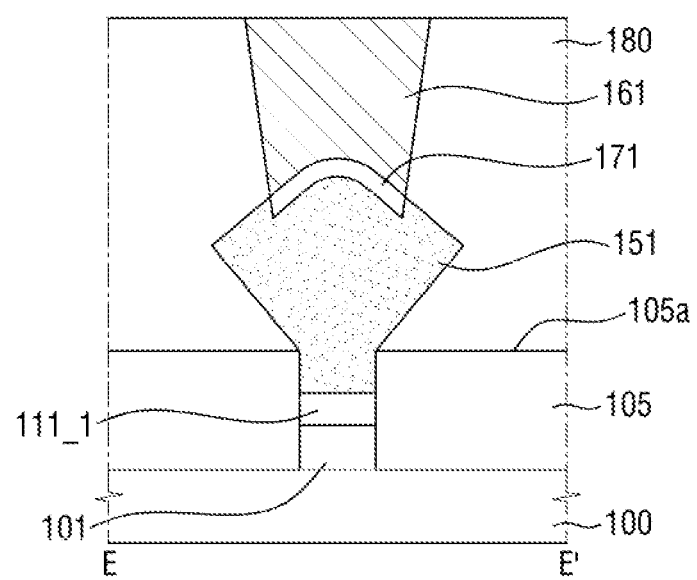
FIGS. 4 and 6 are cross-sectional views taken along line E-E' of FIG. 1.
Figure 5:
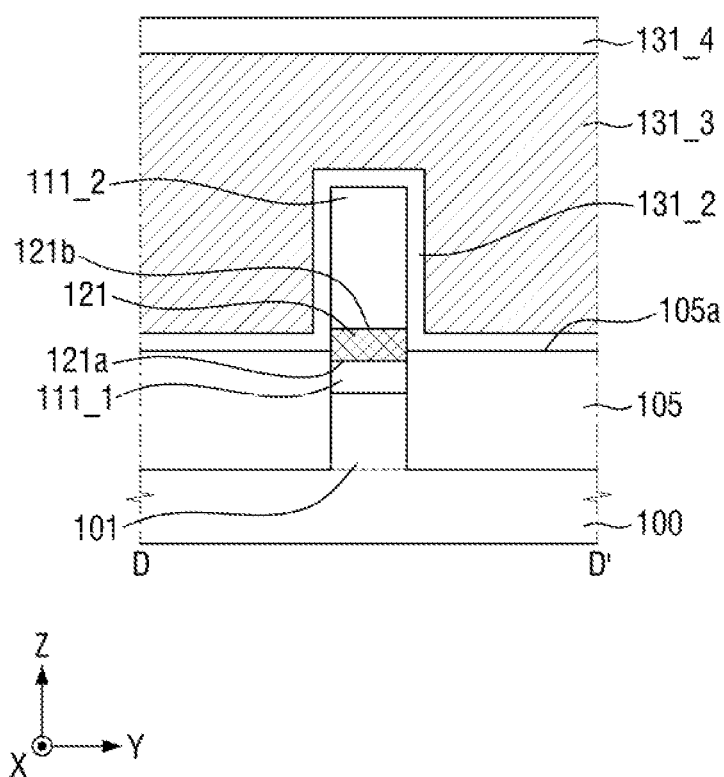
Figure 6:
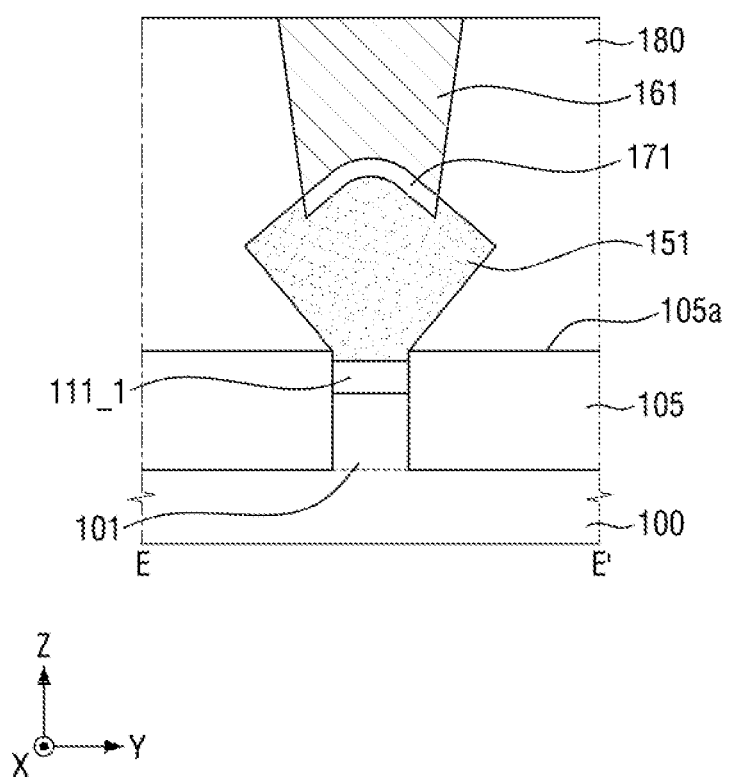
Figure 7:
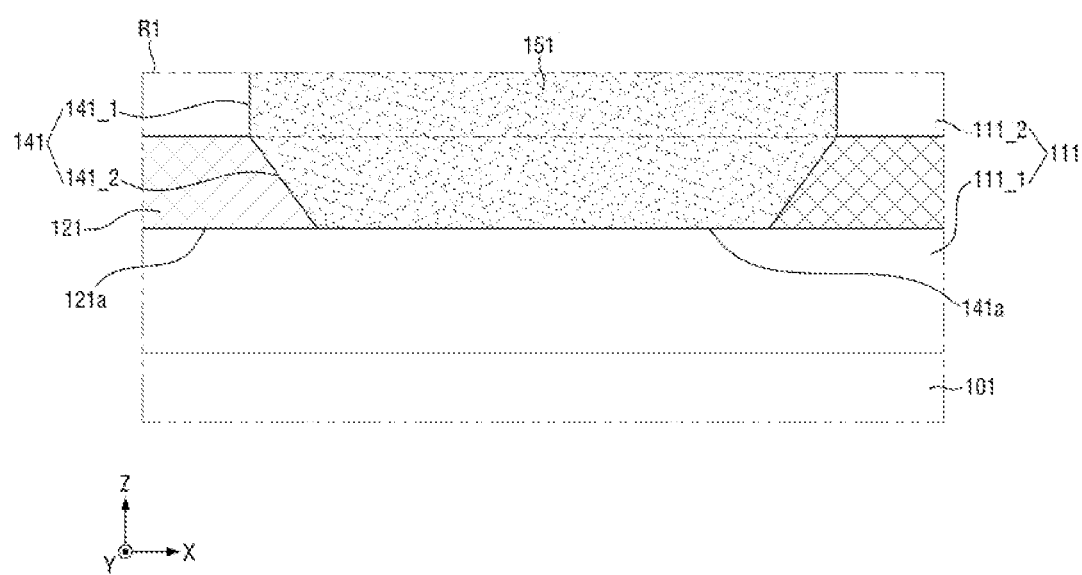
FIG. 7 is an enlarged view of region R1 of FIG. 2.

FIG. 1 is a schematic plan view illustrating a semiconductor device according to an exemplary embodiment of the present disclosure. FIG. 2 is a cross-sectional view taken along lines A-A', B-B' and C-C' of FIG. 1. FIGS. 3 and 5 are cross-sectional views taken along line D-D' of FIG. 1. FIGS. 4 and 6 are cross-sectional views taken along line E-E' of FIG. 1. FIG. 7 is an enlarged view of region R1 of FIG. 2.

Referring to FIGS. 1 to 7, a semiconductor device according to an exemplary embodiment of the present disclosure may include a substrate 100, first to third fin-shaped patterns 101, 102 and 103, a field insulating layer 105, first to third channel layers 111, 112 and 113, first to third etch stop layers 121, 122 and 123, first to sixth gate structures 131, 132, 133, 134, 135 and 136, first to third recesses 141, 142 and 143, first to third source/drain regions 151, 152 and 153, first to third contacts 161, 162 and 163, first to third silicide layers 171, 172 and 173, and an interlayer insulating layer 180.

The substrate 100 may be a bulk silicon substrate or a silicon-on-insulator (SOI) substrate. Alternatively, the substrate 100 may be a silicon substrate or may include other materials such as, for example, silicon germanium (SiGe), silicon germanium on insulator (SGOI), indium antimonide (InSb), a lead tellurium compound (PbTe), indium arsenide (InAs), indium phosphide (InP), gallium arsenide (GaAs), gallium phosphide (GaP), or gallium antimonide (GaSb), but the present disclosure is not limited thereto. The substrate 100 may include one or more semiconductor layers or structures and may include active or operable portions of semiconductor devices.

A first region I in which a first fin structure is formed, a second region II in which a second fin structure is formed, and a third region III in which a third fin structure is formed may be defined in the substrate 100. For example, each of the first region I, the second region II, and the third region III may be a P-type metal-oxide-semiconductor (PMOS) region. However, the present disclosure is not limited thereto. For example, in an exemplary embodiment of the present disclosure, at least one of the first region I, the second region II or the third region III may be an N-type metal-oxide-semiconductor (NMOS) region.

Each of the first region I, the second region II and the third region III may be, for example, a static random access memory (SRAM) element, a logic low voltage element, a logic high voltage element, or a peri transistor. However, the present disclosure is not limited thereto.

The first fin structure may include a first fin-shaped pattern 101, a first channel layer 111, and a first etch stop layer 121. The second fin structure may include a second fin-shaped pattern 102, a second channel layer 112, and a second etch stop layer 122. The third fin structure may include a third fin-shaped pattern 103, a third channel layer 113, and a third etch stop layer 123.

Each of the first to third fin-shaped patterns 101, 102 and 103 may protrude from the substrate 100, and may extend along a first direction X. Although FIG. 1 shows that each of the first to third fin-shaped patterns 101, 102 and 103 is aligned in the first direction X, this is for simplicity of illustration, the present disclosure is not limited thereto. For example, some or all of the first to third fin-shaped patterns 101, 102 and 103 may not be aligned with each other in the first direction X.

The first to third fin-shaped patterns 101, 102 and 103 may be separated from each other. However, the present disclosure is not limited thereto. For example, in an exemplary embodiment of the present disclosure, some of the first to third fin-shaped patterns 101, 102, 103 may be connected to each other.

Each of the first to third fin-shaped patterns 101, 102 and 103 may be formed by etching a portion of the substrate 100, and/or may include an epitaxial layer grown from the substrate 100. Each of the first to third fin-shaped patterns 101, 102 and 103 may include, for example, silicon (Si). However, the present disclosure is not limited thereto. For example, in an exemplary embodiment of the present disclosure, each of the first to third fin-shaped patterns 101, 102 and 103 may include silicon germanium (SiGe). Although silicon germanium is represented by SiGe for simplicity, which may indicate an equal amount of silicon (Si) and germanium (Ge), the atomic ratio of silicon (Si) to germanium (Ge) may not necessarily be 1 to 1. For example, silicon germanium (SiGe) included in each of the first to third fin-shaped patterns 101, 102 and 103 may have germanium (Ge) at a concentration greater than 50% or smaller than 50% in addition to the concentration equal to 50%.

The first channel layer 111 may be disposed on the first fin-shaped pattern 101, and may include, for example, silicon germanium (SiGe). The first channel layer 111 may be, for example, a channel layer of a PMOS transistor. However, the present disclosure is not limited thereto. For example, in an exemplary embodiment of the present disclosure, the first channel layer 111 may be a channel layer of an NMOS transistor. The threshold voltage of the PMOS transistor or NMOS transistor may be controlled by adjusting the germanium (Ge) content of silicon germanium (SiGe) included in the first channel layer 111.

The first channel layer 111 may include a first lower channel layer 111_1 and a first upper channel layer 111_2. The first lower channel layer 111_1 may be disposed on the first fin-shaped pattern 101. The first upper channel layer 111_2 may be disposed on the first lower channel layer 111_1. Each of the first lower channel layer 111_1 and the first upper channel layer 111_2 may include, for example, silicon germanium (SiGe). Silicon germanium (SiGe) included in each of the first lower channel layer 111_1 and the first upper channel layer 111_2 may have higher electron and/or hole mobility than silicon (Si), allowing for lower voltages, and thus reducing power consumption, tunneling, and leakage for the PMOS transistor or the NMOS transistor.

The second channel layer 112 may be disposed on the second fin-shaped pattern 102, and may include, for example, silicon germanium (SiGe). The second channel layer 112 may be, for example, a channel layer of a PMOS transistor. However, the present disclosure is not limited thereto. For example, in an exemplary embodiment of the present disclosure, the second channel layer 112 may be a channel layer of an NMOS transistor. The threshold voltage of the PMOS transistor or NMOS transistor may be controlled by adjusting the germanium (Ge) content of silicon germanium (SiGe) included in the second channel layer 112.

The second channel layer 112 may include a second lower channel layer 112_1 and a second upper channel layer 112_2. The second lower channel layer 112_1 may be disposed on the second fin-shaped pattern 102. The second upper channel layer 112_2 may be disposed on the second lower channel layer 112_1. Each of the second lower channel layer 112_1 and the second upper channel layer 112_2 may include, for example, silicon germanium (SiGe). Silicon germanium (SiGe) included in each of the second lower channel layer 112_1 and the second upper channel layer 112_2 may have higher electron and/or hole mobility than silicon (Si), allowing for lower voltages, and thus reducing power consumption, tunneling, and leakage for the PMOS transistor or NMOS transistor.

The third channel layer 113 may be disposed on the third fin-shaped pattern 103, and may include, for example, silicon germanium (SiGe). The third channel layer 113 may be, for example, a channel layer of a PMOS transistor. However, the present disclosure is not limited thereto. For example, in an exemplary embodiment of the present disclosure, the third channel layer 113 may be a channel layer of an NMOS transistor. The threshold voltage of the PMOS transistor or NMOS transistor may be controlled by adjusting the germanium (Ge) content of silicon germanium (SiGe) included in the third channel layer 113.

The third channel layer 113 may include a third lower channel layer 113_1 and a third upper channel layer 113_2. The third lower channel layer 113_1 may be disposed on the third fin-shaped pattern 103. The third upper channel layer 113_2 may be disposed on the third lower channel layer 113_1. Each of the third lower channel layer 113_1 and the third upper channel layer 113_2 may include, for example, silicon germanium (SiGe). Silicon germanium (SiGe) included in each of the third lower channel layer 113_1 and the third upper channel layer 113_2 may have higher electron and/or hole mobility than silicon (Si), allowing for lower voltages, and thus reducing power consumption, tunneling, and leakage for the PMOS transistor or NMOS transistor.

The first etch stop layer 121 may be disposed inside the first channel layer 111. For example, the first etch stop layer 121 may be disposed between the first lower channel layer 111_1 and the first upper channel layer 111_2. The first etch stop layer 121 may be in direct contact with each of the first lower channel layer 111_1 and the first upper channel layer 111_2.

The second etch stop layer 122 may be disposed inside the second channel layer 112. For example, the second etch stop layer 122 may be disposed between the second lower channel layer 112_1 and the second upper channel layer 112_2. The second etch stop layer 122 may be in direct contact with each of the second lower channel layer 112_1 and the second upper channel layer 112_2.

The third etch stop layer 123 may be disposed inside the third channel layer 113. For example, the third etch stop layer 123 may be disposed between the third lower channel layer 113_1 and the third upper channel layer 113_2. The third etch stop layer 123 may be in direct contact with each of the third lower channel layer 113_1 and the third upper channel layer 113_2.

Similar to the first to third channel layers 111, 112 and 113, each of the first to third etch stop layers 121, 122 and 123 may include silicon germanium (SiGe). The first channel layer 111 may include germanium (Ge) at a first concentration, and the first etch stop layer 121 may include germanium (Ge) at a second concentration smaller than the first concentration. The second channel layer 112 may include germanium (Ge) at a third concentration, and the second etch stop layer 122 may include germanium (Ge) at a fourth concentration smaller than the third concentration. The third channel layer 113 may include germanium (Ge) at a fifth concentration, and the third etch stop layer 123 may include germanium (Ge) at a sixth concentration smaller than the fifth concentration. Since the etch rate of the silicon germanium (SiGe) is dependent on the germanium (Ge) concentration, each of the first to third etch stop layers 121, 122 and 123 may require to have a sufficiently small germanium (Ge) concentration (for example, a concentration smaller than 50% or significantly smaller than 50%) so that each can be used as an etch stop layer by creating sufficient etch rate difference (for example, smaller etch rate)

with respect to each of the corresponding first to third channel layers 111, 112 and 113.

The first concentration, the third concentration and the fifth concentration may be equal to each other. In addition, the second concentration, the fourth concentration and the sixth concentration may be equal to each other. However, the present disclosure is not limited thereto.

Each of the first concentration, the third concentration and the fifth concentration may be about 50%, and each of the second concentration, the fourth concentration and the sixth concentration may be about 30%. However, the present disclosure is not limited thereto.

In an exemplary embodiment of the present disclosure, each of the first to third etch stop layers 121, 122 and 123 may include silicon (Si).

The thickness of each of the first to third etch stop layers 121, 122 and 123 in a third direction Z perpendicular to the first and second directions X and Y may range from about 2 nm to about 10 nm. However, the present disclosure is not limited thereto. The thickness of each of the first to third etch stop layers 121, 122 and 123 may be varied from the desired range depending on the conditions used in forming each of the first to third etch stop layers 121, 122 and 123.

Although FIG. 2 illustrates that the thicknesses of the first to third etch stop layers 121, 122 and 123 in the third directions Z are equal to each other, the present disclosure is not limited thereto. For example, in an exemplary embodiment of the present disclosure, at least one of the thicknesses of the first to third etch stop layers 121, 122 and 123 in the third direction Z may be different.

The field insulating layer 105 may be disposed on the substrate 100. The field insulating layer 105 may be disposed on the sidewall of each of the first to third fin-shaped patterns 101, 102 and 103, the first to third lower channel layers 111_1, 112_1 and 113_1, and the first to third etch stop layers 121, 122 and 123 on the substrate 100. The field insulating layer 105 may include an insulating material, such as, for example, silicon oxide ($SiO_2$), silicon nitride ($Si_3N_4$), silicon oxynitride (SiON), or a combination thereof. In an exemplary embodiment of the present disclosure, the field insulating layer 105 may include silicon oxide ($SiO_2$).

The field insulating layer 105 may be disposed on at least a portion of the sidewall of each of the first to third upper channel layers 111_1, 112_1 and 113_1. For example, as illustrated in FIG. 3, a top surface 121b of the first etch stop layer 121 may be lower than a top surface 105a of the field insulating layer 105. However, the present disclosure is not limited thereto. For example, in an exemplary embodiment of the present disclosure, as shown in FIG. 5, a top surface 121b of the first etch stop layer 121 may be lower than a top surface 105a of the field insulating layer 105. In this case, the top surface 105a of the field insulating layer 105 may be formed between a bottom surface 121a of the first etch stop layer 121 and the top surface 121b of the first etch stop layer 121.

The first gate structure 131 and the second gate structure 132 may extend in a second direction Y different from the first direction X on the first channel layer 111, and may cross the first fin-shaped pattern 101. The first gate structure 131 may be spaced apart from the second gate structure 132 in the first direction X.

A third gate structure 133 and a fourth gate structure 134 may extend in the second direction Y on the second channel layer 112, and may cross the second fin-shaped pattern 102. The third gate structure 133 may be spaced apart from the fourth gate structure 134 in the first direction X.

A fifth gate structure 135 and a sixth gate structure 136 may extend in the second direction Y on the third channel layer 113, and may cross the third fin-shaped pattern 103. The fifth gate structure 135 may be spaced apart from the sixth gate structure 136 in the first direction X.

The first gate structure 131 may include gate spacers 131_1, a gate insulating layer 131_2, a gate electrode 131_3, and a capping pattern 131_4.

The gate electrode 131_3 may extend in the second direction Y on the first channel layer 111, and may include a metal nitride, a metal carbide, a metal, or a combination thereof. The gate electrode 131_3 may include, for example, at least one selected from the group including titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof. In an exemplary embodiment of the present disclosure, the gate electrode 131_3 may include at least two layers that are stacked. For example, the first layer of the gate electrode 131_3 may control a work function, and may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), titanium aluminum carbonitride (TiAlCN), titanium aluminum carbide (TiAlC), titanium carbide (TiC), tantalum carbonitride (TaCN), niobium nitride (NbN), niobium carbide (NbC), molybdenum nitride (MoN), molybdenum carbide (MoC), tungsten carbide (WC), or a combination thereof The second layer of the gate electrode 131_3 may serve to fill a space formed by the first layer, and may include at least one of, for example, ruthenium (Ru), titanium aluminum (TiAl), tungsten (W), aluminum (Al), copper (Cu), cobalt (Co), titanium (Ti), tantalum (Ta), nickel (Ni), platinum (Pt), nickel platinum (NiPt), niobium (Nb), molybdenum (Mo), rhodium (Rh), palladium (Pd), iridium (Ir), osmium (Os), silver (Ag), gold (Au), zinc (Zn), vanadium (V) or a combination thereof The gate spacers 131_1 may be disposed on both sidewalls of the gate electrode 131_3. For example, the gate spacer 131_1 may include, for example, at least one of silicon nitride ($Si_3N_4$), silicon oxynitride (SiON), silicon oxide ($SiO_2$), silicon carbonitride (SiCN), or silicon oxycarbonitride (SiOCN).

The gate insulating layer 131_2 may be disposed between the gate electrode 131_3 and the first channel layer 111, and between the gate electrode 131_3 and the gate spacer 131_1. Also, the gate insulating layer 131_2 may be disposed between the gate electrode 131_3 and the field insulating layer 105.

The gate insulating layer 131_2 may include a high dielectric material having a dielectric constant higher than that of a silicon oxide ($SiO_2$) layer. The gate insulating layer 131_2 may include, for example, at least one selected from the group including hafnium oxide (HfO$_2$), hafnium silicon oxide (HfSiO$_4$), hafnium aluminum oxide (HfAlO$_3$), lanthanum oxide (La$_2$O$_3$), lanthanum aluminum oxide (LaAlO$_3$), zirconium oxide (ZrO$_2$), zirconium silicon oxide (ZrSiO$_4$), tantalum oxide (Ta$_2$O$_5$), titanium oxide (TiO$_2$), barium strontium titanium oxide (BaSrTi$_2$O$_6$), barium titanium oxide (BaTiO$_3$), strontium titanium oxide (SrTiO$_3$), yttrium oxide (Y$_2$O$_3$), aluminum oxide (Al$_2$O$_3$), lead scandium tantalum oxide (Pb(Sc,Ta)O$_3$) and lead zinc niobate [Pb(Zn$_{1/3}$Nb$_{2/3}$)O$_3$].

The capping pattern 131_4 may be disposed between the gate spacers 131_1 on the gate electrode 131_3. The capping pattern 131_4 may include, for example, at least one of silicon oxide (SiO$_2$), silicon nitride (Si$_3$N$_4$), silicon oxynitride (SiON), silicon carbonitride (SiCN), or silicon oxycarbonitride (SiOCN).

Although FIG. 2 illustrates that the gate insulating layer 131_2 does not extend between the gate spacer 131_1 and the capping pattern 131_4, for example, the capping pattern 131_4 may be disposed on the gate electrode 131_3 and the gate insulating layer 131_2, and may extend along the gate electrode 131_3 in the second direction Y, the present disclosure is not limited thereto. Further, in an exemplary embodiment of the present disclosure, the capping pattern 131_4 may be omitted as needed.

Each of the second to sixth gate structures 132, 133, 134, 135 and 136 may have a structure the same as that of the first gate structure 131. Thus, a description of each of the second to sixth gate structures 132, 133, 134, 135 and 136 will be omitted.

A first recess 141 may be formed on at least one side of the first gate structure 131. For example, the first recess 141 may be formed between the first gate structure 131 and the second gate structure 132, and may pass through the first upper channel layer 111_2 and the first etch stop layer 121 in the third direction Z. For example, a bottom surface 141a of the first recess 141 may be formed on a plane the same as that of a bottom surface 121a of the first etch stop layer 121. The first lower channel layer 111_1 may be exposed by the first recess 141.

The first recess 141 may include a first portion 141_1 formed in the first upper channel layer 111_2 and a second portion 141_2 formed in the first etch stop layer 121.

An inclined profile of the sidewall of the second portion 141_2 of the first recess 141 may be different from an inclined profile of the sidewall of the first portion 141_1 of the first recess 141. For example, the first portion 141_1 of the first recess 141 may have a nearly vertical or slightly sloped sidewall profile, while the second portion 141_2 of the first recess 141 may have a sloped sidewall profile. That is, the inclined profile of the sidewall of the first recess 141 may have an inflection point at an interface between the first upper channel layer 111_2 and the first etch stop layer 121, which may be due to a difference in etching selectivity between the first upper channel layer 111_2 and the first etch stop layer 121. For example, the first upper channel layer 111_2 may have an etching selectivity (or an etch rate) higher than that of the first etch stop layer 121 during the etching process of forming the first recess 141.

The second recess 142 may be formed on at least one side of the third gate structure 133. For example, the second recess 142 may be formed between the third gate structure 133 and the fourth gate structure 134, and may pass through the second upper channel layer 112_2 and the second etch stop layer 122 in the third direction Z. For example, the bottom surface of the second recess 142 may be formed on a plane the same as that of the bottom surface of the second etch stop layer 122. The second lower channel layer 112_1 may be exposed by the second recess 142.

The second recess 142 may include a first portion formed in the second upper channel layer 112_2 and a second portion formed in the second etch stop layer 122.

An inclined profile of the sidewall of the second portion of the second recess 142 may be different from an inclined profile of the sidewall of the first portion of the second recess 142. For example, the first portion of the second recess 142 may have a nearly vertical or slightly sloped sidewall profile, while the second portion of the second recess 142 may have a sloped sidewall profile. That is, the inclined profile of the sidewall of the second recess 142 may have an inflection point at an interface between the second upper channel layer 112_2 and the second etch stop layer 122, which may be due to a difference in etching selectivity between the second upper channel layer 112_2 and the second etch stop layer 122. For example, the second upper channel layer 112_2 may have an etching selectivity (or an etch rate) higher than that of the second etch stop layer 122 during the etching process of forming the second recess 142.

The third recess 143 may be formed on at least one side of the fifth gate structure 135. For example, the third recess 143 may be formed between the fifth gate structure 135 and the sixth gate structure 136, and may pass through the third upper channel layer 113_2 and the third etch stop layer 123 in the third direction Z. For example, the bottom surface of the third recess 143 may be formed on a plane the same as that of the bottom surface of the third etch stop layer 123. The third lower channel layer 113_1 may be exposed by the third recess 143.

The third recess 143 may include a first portion formed in the third upper channel layer 113_2 and a second portion formed in the third etch stop layer 123.

An inclined profile of the sidewall of the second portion of the third recess 143 may be different from an inclined profile of the sidewall of the first portion of the third recess 143. For example, the first portion of the third recess 143 may have a nearly vertical or slightly sloped sidewall profile, while the second portion of the third recess 143 may have a sloped sidewall profile. That is, the inclined profile of the sidewall of the third recess 143 may have an inflection point at an interface between the third upper channel layer 113_2 and the third etch stop layer 123, which may be due to a difference in etching selectivity between the third upper channel layer 113_2 and the third etch stop layer 123. For example, the third upper channel layer 113_2 may have an etching selectivity (or an etch rate) higher than that of the third etch stop layer 123 during the etching process of forming the third recess 143.

The first recess 141 may have a first width W1 in the first direction X. The second recess 142 may have a second width W2 in the first direction X. The third recess 143 may have a third width W3 in the first direction X. The first to third widths W1, W2 and W3 may be different from each other. For example, the third width W3 may be larger than the second width W2, and the second width W2 may be larger than the first width W1. However, the present disclosure is not limited thereto. For example, in an exemplary embodiment of the present disclosure, two widths of the first to third widths W1, W2 and W3 may be equal to each other.

The first recess 141 may have a first depth D1 in the third direction Z. The second recess 142 may have a second depth D2 in the third direction Z. The third recess 143 may have a third depth D3 in the third direction Z. Here, the first depth D1 refers to a depth from the bottom surface of the first gate structure 131 (or the second gate structure 132) to the bottom surface 141a of the first recess 141. The second depth D2 refers to a depth from the bottom surface of the third gate structure 133 (or the fourth gate structure 134) to the bottom surface of the second recess 142. The third depth D3 refers to a depth from the bottom surface of the fifth gate structure 135 (or the sixth gate structure 136) to the bottom surface of the third recess 143. The first to third depths D1, D2 and D3 may be equal to each other.

A first source/drain region 151 may be disposed in the first recess 141, and may be in contact with the first lower channel layer 111_1.

The top surface of the first source/drain region 151 may be formed to be higher than each of the bottom surface of the first gate structure 131 and the bottom surface of the second gate structure 132. However, the present disclosure is not limited thereto.

A second source/drain region 152 may be disposed in the second recess 142, and may be in contact with the second lower channel layer 112_1.

The top surface of the second source/drain region 152 may be formed to be higher than each of the bottom surface of the third gate structure 133 and the bottom surface of the fourth gate structure 134. However, the present disclosure is not limited thereto.

A third source/drain region 153 may be disposed in the third recess 143, and may be in contact with the third lower channel layer 113_1.

The top surface of the third source/drain region 153 may be formed to be higher than each of the bottom surface of the fifth gate structure 135 and the bottom surface of the sixth gate structure 136. However, the present disclosure is not limited thereto.

Since the first to third source/drain regions 151, 152 and 153 are respectively formed in the first to third recesses 141, 142 and 143, the first to third source/drain regions 151, 152 and 153 may have horizontal widths different from each other, but may have the same vertical depth.

The sidewall of at least a portion of each of the first to third source/drain regions 151, 152 and 153 may be in contact with the field insulating layer 105. However, the present disclosure is not limited thereto.

The interlayer insulating layer 180 may be disposed to cover the top surface of each of the first to third source/drain regions 151, 152 and 153, and the sidewall of each of the first to sixth gate structures 131, 132, 133, 134, 135 and 136, and the top surface of the field insulating layer 105. For example, the interlayer insulating layer 180 may be formed to be in contact with outer sidewalls of the gate spacers 131_1. The interlayer insulating layer 180 may include, for example, at least one of silicon oxide ($SiO_2$), silicon nitride ($Si_3N_4$), silicon oxynitride (SiON), or a low-k dielectric material. As an example, the low-k dielectric material may include carbon-doped silicon oxide, such as SiCOH.

A first contact 161 may pass through the interlayer insulating layer 180 in the third direction Z to be connected to the first source/drain region 151. A second contact 162 may pass through the interlayer insulating layer 180 in the third direction Z to be connected to the second source/drain region 152. A third contact 163 may pass through the interlayer insulating layer 180 in the third direction Z to be connected to the third source/drain region 153. The first to third contact plugs 161, 162 and 163 may each be formed of a metal, such as, for example, tungsten (W), cobalt (Co), titanium (Ti), or the like.

Although FIG. 2 illustrates that the bottom surface of the first contact 161 is formed on a plane the same as that of the top surface of the first source/drain region 151, the bottom surface of the second contact 162 is formed on a plane the same as that of the top surface of the second source/drain region 152, and the bottom surface of the third contact 163 is formed on a plane the same as that of the top surface of the third source/drain region 153, the present disclosure is not limited thereto. For example, in an exemplary embodiment of the present disclosure, each of the first to third contacts 161, 162 and 163 may extend into each of the first to third source/drain regions 151, 152 and 153.

A first silicide layer 171 may be disposed between the first contact 161 and the first source/drain region 151. A second silicide layer 172 may be disposed between the second contact 162 and the second source/drain region 152. A third silicide layer 173 may be disposed between the third contact 163 and the third source/drain region 153. The first to third silicide layers 171, 172 and 173 may each be formed of a material, such as, for example, cobalt silicide (CoSi), nickel silicide (NiSi), titanium silicide (TiSi), or the like.

In the semiconductor device according to an exemplary embodiment of the present disclosure, by forming an etch stop layer inside the channel layer to adjust the depth of the source/drain region, the loading between elements may be enhanced, and the variation of the source/drain regions may be reduced. For example, the source/drain regions may have a uniform depth.

Hereinafter, a semiconductor device according to an exemplary embodiment of the present disclosure will be described with reference to FIGS. 8 and 9. Differences from the semiconductor device shown in FIGS. 2 to 7 will be mainly described.

Figure 8:
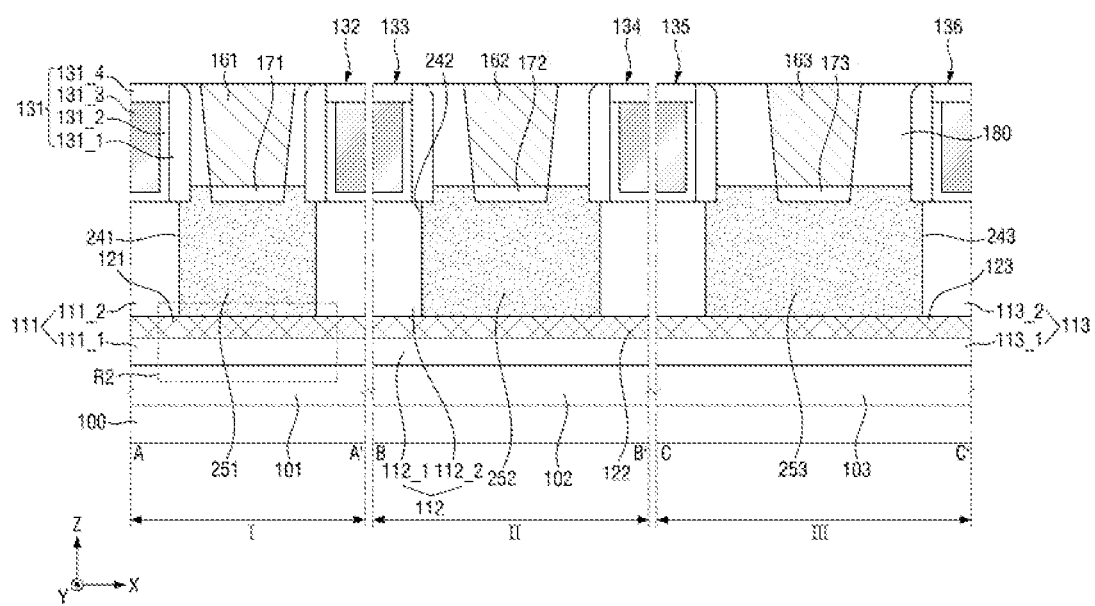
FIG. 8 is a cross-sectional view illustrating a semiconductor device according to an exemplary embodiment of the present disclosure.

FIG. 8 is a cross-sectional view illustrating a semiconductor device according to an exemplary embodiment of the present disclosure. FIG. 9 is an enlarged view of region R2 of FIG. 8.

Figure 9:
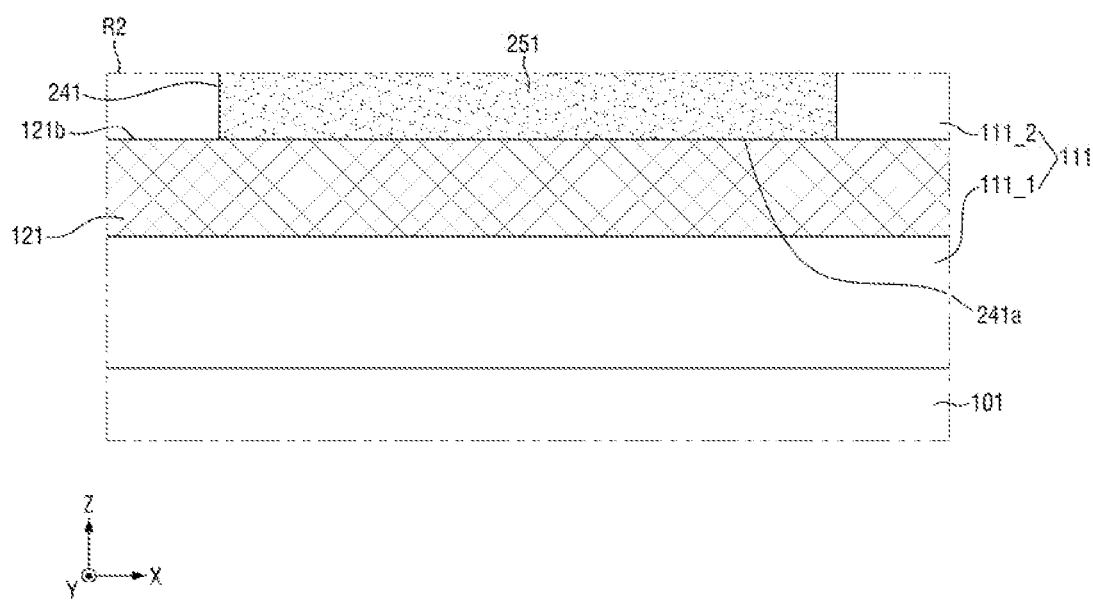
FIG. 9 is an enlarged view of region R2 of FIG. 8.

Referring to FIGS. 8 and 9, in a semiconductor device according to an exemplary embodiment of the present disclosure, the bottom surfaces of first to third recesses 241, 242 and 243 may be formed on a plane the same as that of the top surfaces of the first to third etch stop layers 121, 122 and 123, respectively.

A bottom surface 241a of the first recess 241 may be formed on a plane the same as that of the top surface 121b of the first etch stop layer 121. The bottom surface of the second recess 242 may be formed on a plane the same as that of the top surface of the second etch stop layer 122. The bottom surface of the third recess 243 may be formed on a plane the same as that of the top surface of the third etch stop layer 123.

A first source/drain region 251 may be in contact with the top surface 121b of the first etch stop layer 121. A second source/drain region 252 may be in contact with the top surface of the second etch stop layer 122. A third source/drain region 253 may be in contact with the top surface of the third etch stop layer 123. In the present exemplary embodiment, the first to third etch stop layers 121, 122 and 123 may provide a uniform depth for the first to third source/drain regions 251, 252 and 253 to reduce variations.

Hereinafter, a semiconductor device according to an exemplary embodiment of the present disclosure will be described with reference to FIGS. 10 and 11. Differences from the semiconductor device shown in FIGS. 2 to 7 will be mainly described.

Figure 10:
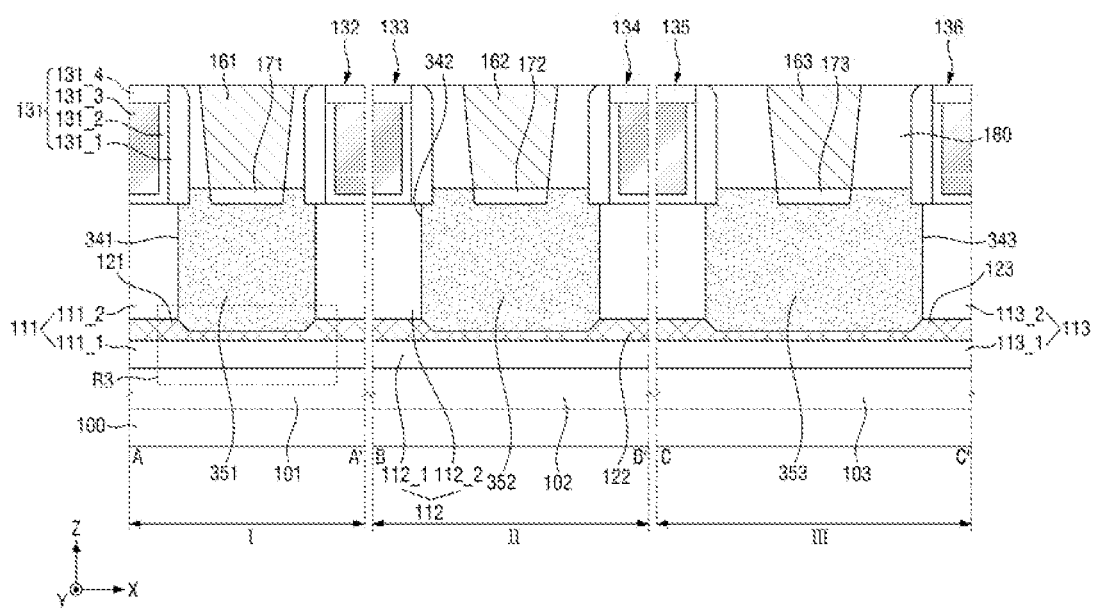
FIG. 10 is a cross-sectional view illustrating a semiconductor device according to an exemplary embodiment of the present disclosure.

FIG. 10 is a cross-sectional view illustrating a semiconductor device according to an exemplary embodiment of the present disclosure. FIG. 11 is an enlarged view of region R3 of FIG. 10.

Figure 11:
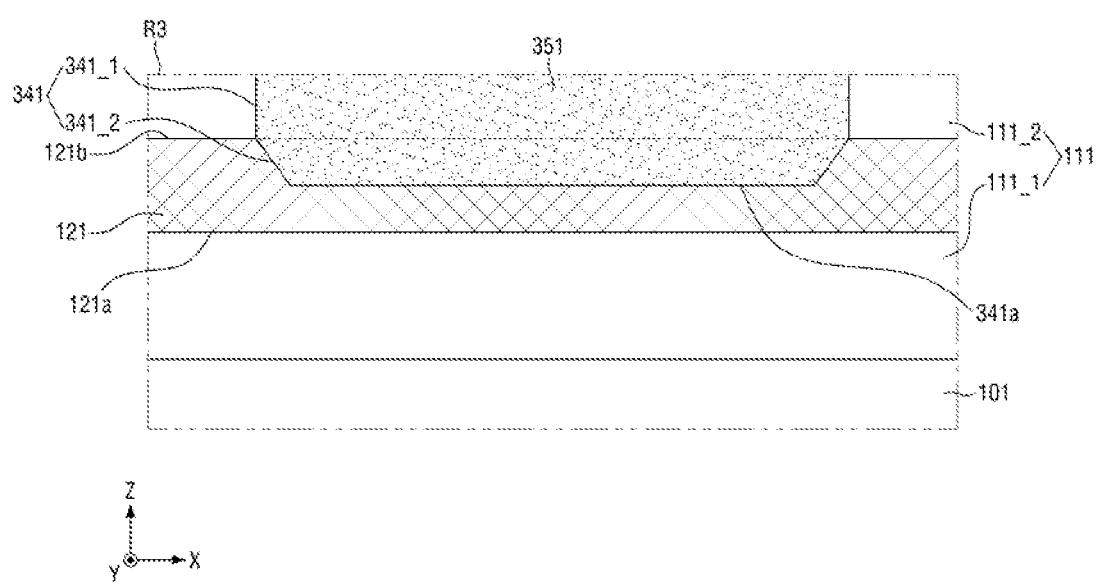
FIG. 11 is an enlarged view of region R3 of FIG. 10.

Referring to FIGS. 10 and 11, in a semiconductor device according to an exemplary embodiment of the present disclosure, the bottom surfaces of first to third recesses 341, 342 and 343 may be formed inside the first to third etch stop layers 121, 122 and 123, respectively.

A bottom surface 341a of the first recess 341 may be formed between the top surface 121b of the first etch stop layer 121 and the bottom surface 121a of the first etch stop layer 121. The bottom surface of the second recess 342 may be formed between the top surface of the second etch stop layer 122 and the bottom surface of the second etch stop layer 122. The bottom surface of the third recess 343 may be formed between the top surface of the third etch stop layer 123 and the bottom surface of the third etch stop layer 123.

The first recess 341 may include a first portion 341_1 formed in the first upper channel layer 111_2 and a second portion 341_2 formed in the first etch stop layer 121. In an exemplary embodiment of the present disclosure, the first portion 341_1 of the first recess 341 may have a nearly vertical or slightly sloped sidewall profile, while the second portion 341_2 of the first recess 341 may have a sloped sidewall profile. For example, the first upper channel layer 111_2 may have an etching selectivity (or an etch rate) higher than that of the first etch stop layer 121 during the etching process of forming the first recess 341. Each of the second recess 342 and the third recess 343 may have a structure which is the same as or similar to that of the first recess 341.

A portion of a first source/drain region 351 may be disposed inside the first etch stop layer 121, a portion of the second source/drain region 352 may be disposed inside the second etch stop layer 122, and a portion of the third source/drain region 353 may be disposed inside the third etch stop layer 123. In the present exemplary embodiment, the first to third etch stop layers 121, 122 and 123 may reduce depth dispersion for the first to third source/drain regions 351, 352 and 353.

Hereinafter, a semiconductor device according to an exemplary embodiment of the present disclosure will be described with reference to FIGS. 12 and 13. Differences from the semiconductor device shown in FIGS. 2 to 7 will be mainly described.

Figure 12:
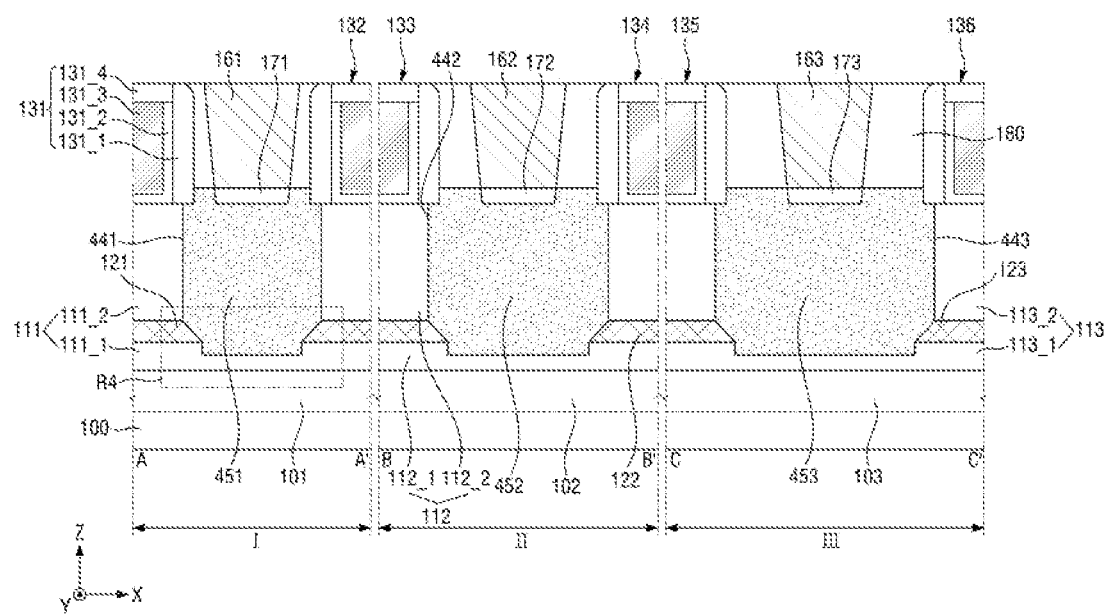
FIG. 12 is a cross-sectional view illustrating a semiconductor device according to an exemplary embodiment of the present disclosure.

FIG. 12 is a cross-sectional view illustrating a semiconductor device according to an exemplary embodiment of the present disclosure. FIG. 13 is an enlarged view of region R4 of FIG. 12.

Figure 13:
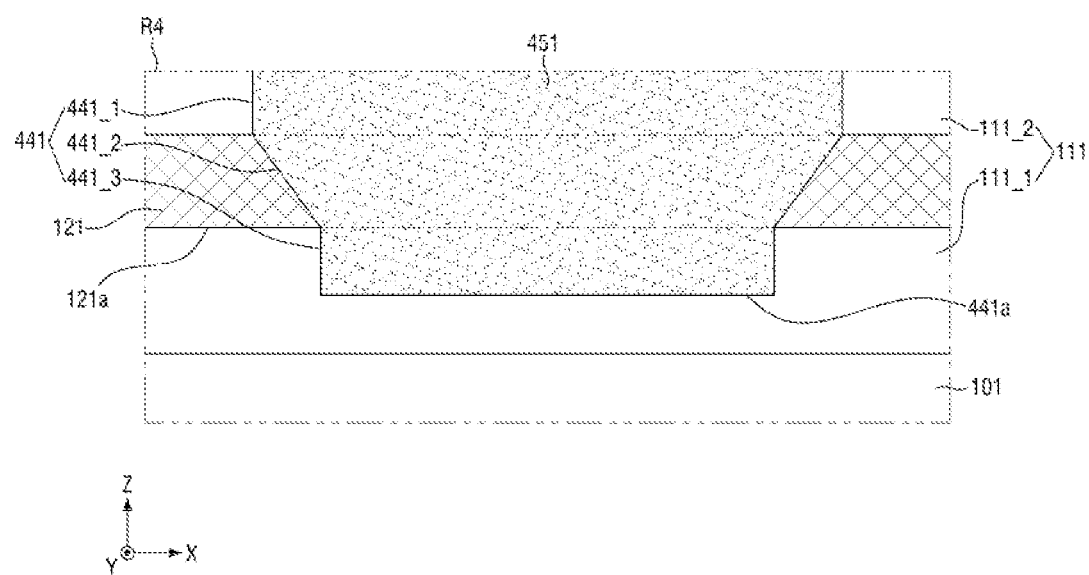
FIG. 13 is an enlarged view of region R4 of FIG. 12.

Referring to FIGS. 12 and 13, in a semiconductor device according to an exemplary embodiment of the present disclosure, the bottom surfaces of first to third recesses 441, 442 and 443 may be formed inside the first to third lower channel layers 111_1, 112_1, and 113_1, respectively.

A bottom surface 441a of the first recess 441 may be formed inside the first lower channel layer 111_1. The bottom surface of the second recess 442 may be formed inside the second lower channel layer 112_1. The bottom surface of the third recess 443 may be formed inside the third lower channel layer 113_1.

The first recess 441 may include a first portion 441_1 formed inside the first upper channel layer 111_2, a second portion 441_2 formed inside the first etch stop layer 121, and a third portion 441_3 formed inside the first lower channel layer 111_1.

An inclined profile of the sidewall of the second portion 441_2 of the first recess 441 may be different from each of an inclined profile of the sidewall of the first portion 441_1 of the first recess 441 and an inclined profile of the sidewall of the third portion 441_3 of the first recess 441. That is, the inclined profile of the sidewall of the first recess 441 may have an inflection point at an interface between the first upper channel layer 111_2 and the first etch stop layer 121. In addition, the inclined profile of the sidewall of the first recess 441 may have an inflection point at an interface between the first etch stop layer 121 and the first lower channel layer 111_1. In an exemplary embodiment of the present disclosure, the first portion 441_1 of the first recess 441 and the third portion 441_3 of the first recess 441 may have a nearly vertical or slightly sloped sidewall profile, while the second portion 441_2 of the first recess 441 may have a sloped sidewall profile. For example, the first upper channel layer 111_2 and the first lower channel layer 111_1 may each have an etching selectivity (or an etch rate) higher than that of the first etch stop layer 121 during the etching process of forming the first recess 441.

An inclined profile of the sidewall of the first portion 441_1 of the first recess 441 may be the same as an inclined profile of the sidewall of the third portion 441_3 of the first recess 441. However, the present disclosure is not limited thereto.

Each of the second recess 442 and the third recess 443 may have a structure which is the same as or similar to that of the first recess 441.

A portion of a first source/drain region 451 may be disposed inside the first lower channel layer 111_1, a portion of the second source/drain region 452 may be disposed inside the second lower channel layer 112_1, and a portion of a third source/drain region 453 may be disposed inside the third lower channel layer 113_1. In the present exemplary embodiment, the first to third etch stop layers 121, 122 and 123 may reduce depth dispersion for the first to third source/drain regions 451, 452 and 453.

Hereinafter, a semiconductor device according to an exemplary embodiment of the present disclosure will be described with reference to FIGS. 14 and 15. Differences from the semiconductor device shown in FIGS. 2 to 7 will be mainly described.

Figure 14:
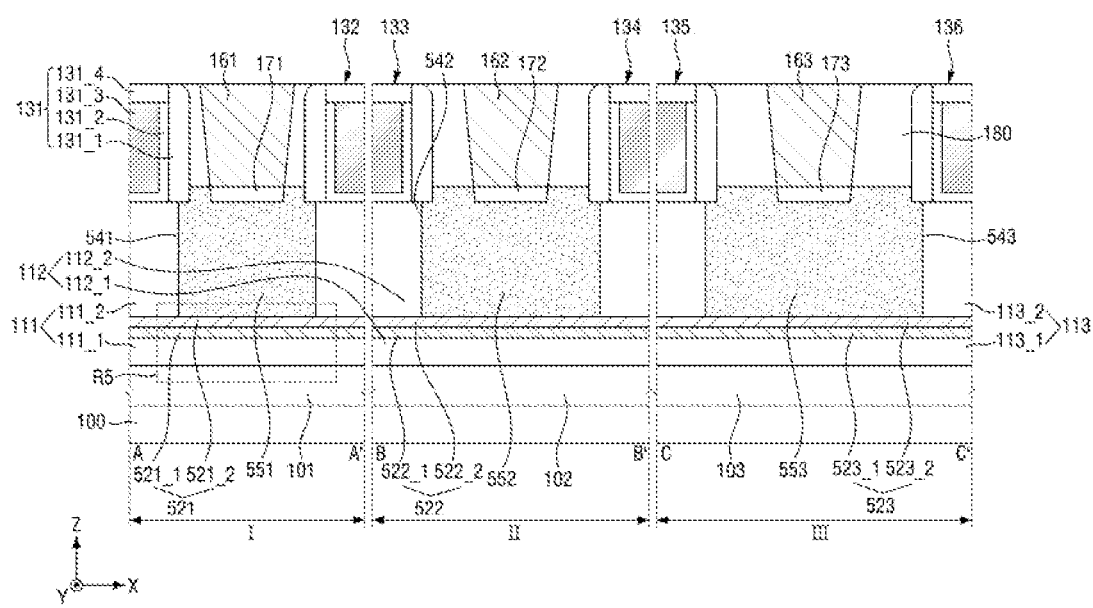
FIG. 14 is a cross-sectional view illustrating a semiconductor device according to an exemplary embodiment of the present disclosure.

FIG. 14 is a cross-sectional view illustrating a semiconductor device according to an exemplary embodiment of the present disclosure. FIG. 15 is an enlarged view of region R5 of FIG. 14.

Figure 15:
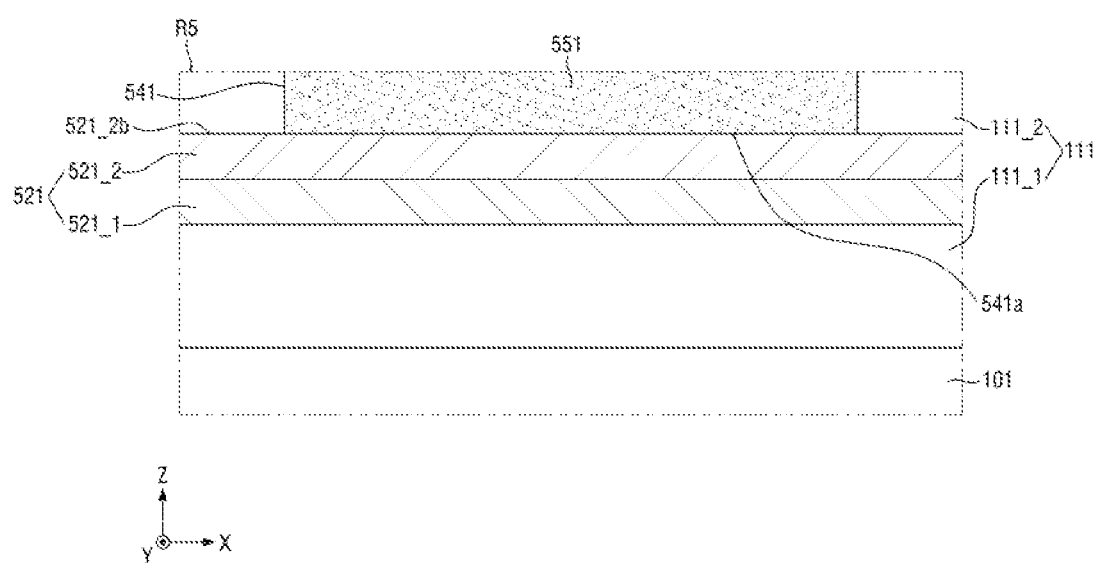
FIG. 15 is an enlarged view of region R5 of FIG. 14.

Referring to FIGS. 14 and 15, in a semiconductor device according to an exemplary embodiment of the present disclosure, the bottom surfaces of first to third recesses 541, 542 and 543 may be formed on a plane the same as that of the top surfaces of first to third etch stop layers 521, 522 and 523, respectively.

The first etch stop layer 521 may include a first layer 521_1 disposed on the first lower channel layer 111_1 and a second layer 521_2 disposed on the first layer 521_1. The second etch stop layer 522 may include a first layer 522_1 disposed on the second lower channel layer 112_1 and a second layer 522_2 disposed on the first layer 522_1. The third etch stop layer 523 may include a first layer 523_1 disposed on the third lower channel layer 113_1 and a second layer 523_2 disposed on the first layer 523_1.

Similar to the first to third channel layers 111, 112 and 113, each of the first layer 521_1 of the first etch stop layer 521, the first layer 522_1 of the second etch stop layer 522, and the first layer 523_1 of the third etch stop layer 523 may include, for example, silicon germanium (SiGe).

The first channel layer 111 may include germanium (Ge) at a first concentration, and the first layer 521_1 of the first etch stop layer 521 may include germanium (Ge) at a second concentration smaller than the first concentration. The second channel layer 112 may include germanium (Ge) at a third concentration, and the first layer 522_1 of the second etch stop layer 522 may include germanium (Ge) at a fourth concentration smaller than the third concentration. The third channel layer 113 may include germanium (Ge) at a fifth concentration, and the first layer 523_1 of the third etch stop layer 523 may include germanium (Ge) at a sixth concentration smaller than the fifth concentration.

Each of the second layer 521_2 of the first etch stop layer 521, the second layer 522_2 of the second etch stop layer 522, and the second layer 523_2 of the third etch stop layer 523 may include, for example, silicon (Si).

A first source/drain region 551 may be in contact with a top surface 521_2b of the second layer 521_2 of the first etch stop layer 521, a second source/drain region 552 may be in contact with a top surface of the second layer 522_2 of the second etch stop layer 522, and a third source/drain region 553 may be in contact with the top surface of the second layer 523_2 of the third etch stop layer 523. In the present exemplary embodiment, the second layer 521_2 of the first etch stop layer 521, the second layer 522_2 of the second etch stop layer 522, the second layer 523_2 of the third etch stop layer 523 may provide a uniform depth for the first to third source/drain regions 551, 552 and 553 to reduce variations.

Hereinafter, a semiconductor device according to an exemplary embodiment of the present disclosure will be described with reference to FIGS. 16 and 17. Differences from the semiconductor device shown in FIGS. 14 and 15 will be mainly described.

Figure 16:
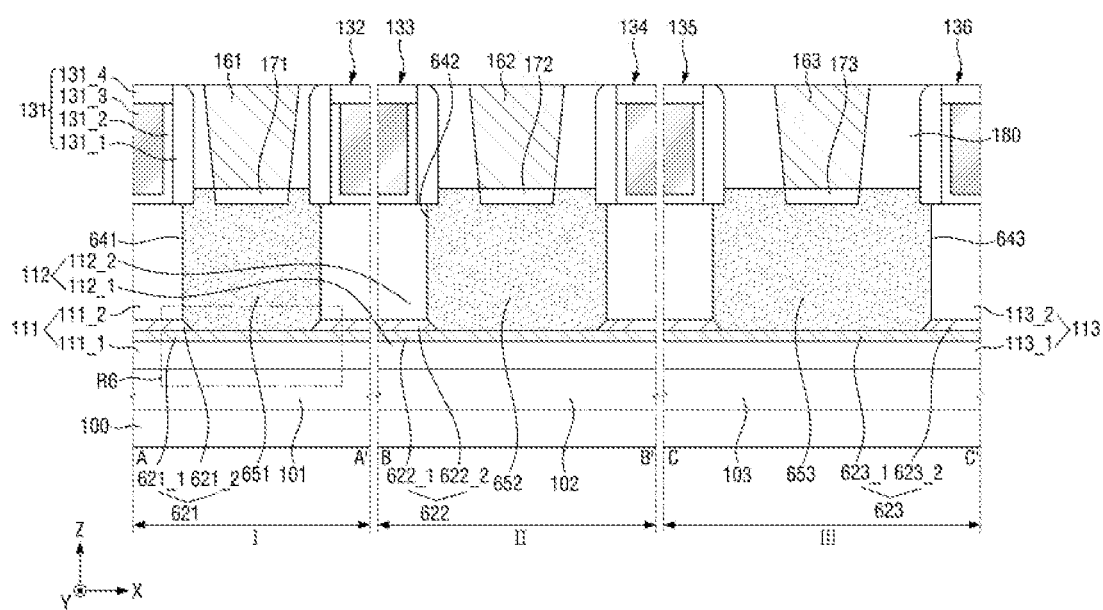
FIG. 16 is a cross-sectional view illustrating a semiconductor device according to an exemplary embodiment of the present disclosure.

FIG. 16 is a cross-sectional view illustrating a semiconductor device according to an exemplary embodiment of the present disclosure. FIG. 17 is an enlarged view of region R6 of FIG. 16.

Figure 17:
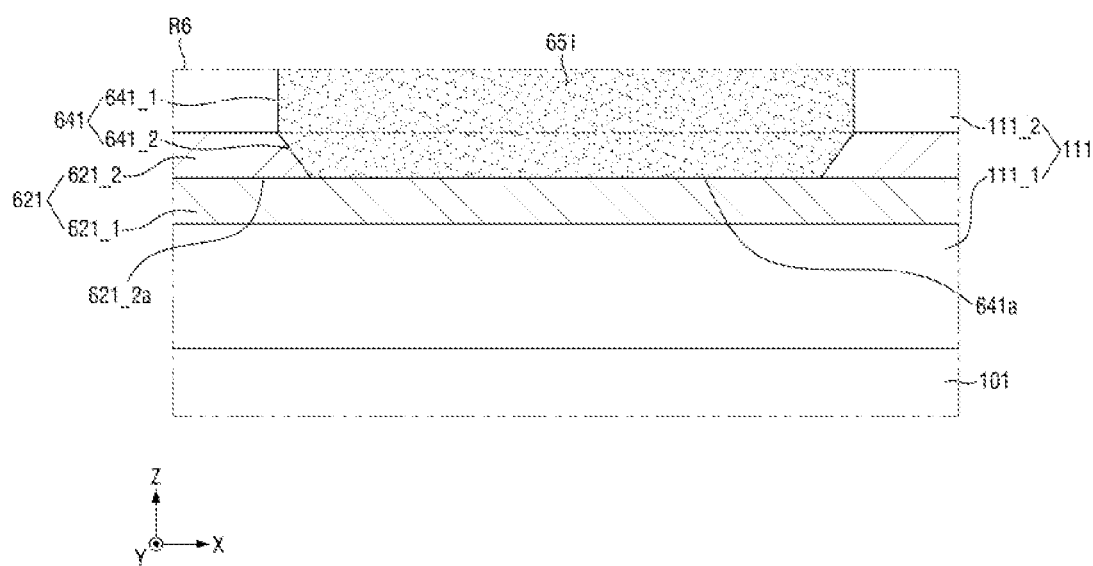
FIG. 17 is an enlarged view of region R6 of FIG. 16.

Referring to FIGS. 16 and 17, in a semiconductor device according to an exemplary embodiment of the present disclosure, the bottom surfaces of first to third recesses 641, 642 and 643 may be formed inside first to third etch stop layers 621, 622 and 623, respectively.

A bottom surface 641a of the first recess 641 may be formed on a plane the same as that of a bottom surface 621_2a of a second layer 621_2 of the first etch stop layer 621. The bottom surface of the second recess 642 may be formed on a plane the same as that of the bottom surface of a second layer 622_2 of the second etch stop layer 622. The bottom surface of the third recess 643 may be formed on a plane the same as that of the bottom surface of a second layer 623_2 of the third etch stop layer 623.

The first recess 641 may include a first portion 641_1 formed inside the first upper channel layer 111_2 and a second portion 641_2 formed inside a second layer 621_2 of the first etch stop layer 621.

An inclined profile of the sidewall of the second portion 641_2 of the first recess 641 may be different from an inclined profile of the sidewall of the first portion 641_1 of the first recess 641. That is, the inclined profile of the sidewall of the first recess 641 may have an inflection point at an interface between the first upper channel layer 111_2 and the first etch stop layer 621. In an exemplary embodiment of the present disclosure, the first portion 641_1 of the first recess 641 may have a nearly vertical or slightly sloped sidewall profile, while the second portion 641_2 of the first recess 641 may have a sloped sidewall profile. For example, the first upper channel layer 111_2 may have an etching selectivity (or an etch rate) higher than that of the first etch stop layer 621 during the etching process of forming the first recess 641.

Each of the second recess 642 and the third recess 643 may have a structure which is the same as or similar to that of the first recess 641.

A first source/drain region 651 may be in contact with the top surface of a first layer 621_1 of the first etch stop layer 621. A second source/drain region 652 may be in contact with the top surface of a first layer 622_1 of the second etch stop layer 622. A third source/drain region 653 may be in contact with the top surface of a first layer 623_1 of the third etch stop layer 623. In the present exemplary embodiment, the first to third etch stop layers 621, 622 and 623 may provide a uniform depth for the first to third source/drain regions 651, 652 and 653 to reduce variations.

Hereinafter, a semiconductor device according to an exemplary embodiment of the present disclosure will be described with reference to FIGS. 18 and 19. Differences from the semiconductor device shown in FIGS. 14 and 15 will be mainly described.

Figure 18:
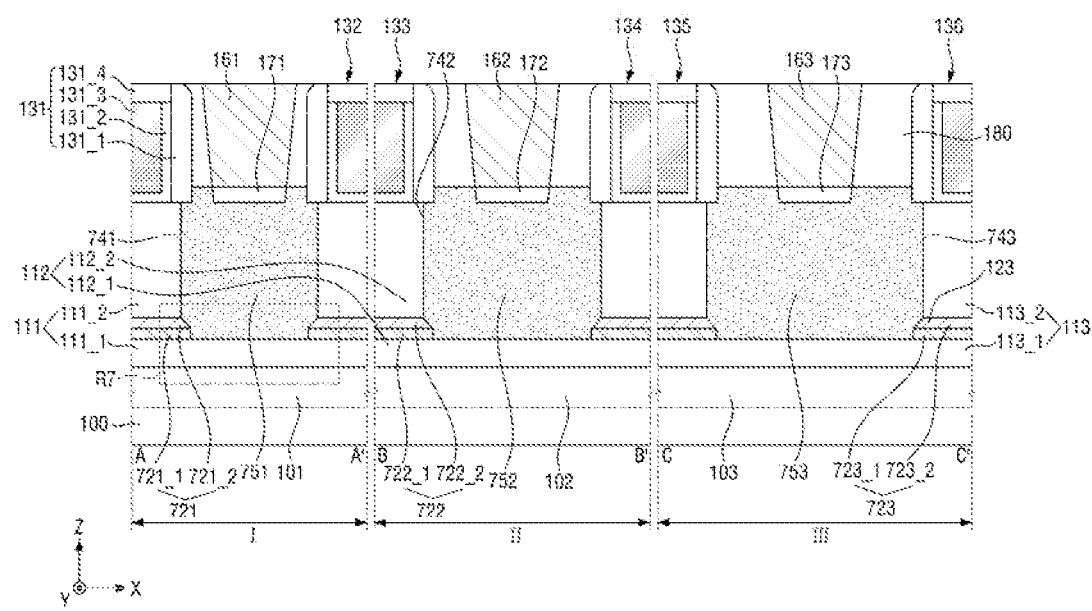
FIG. 18 is a cross-sectional view illustrating a semiconductor device according to an exemplary embodiment of the present disclosure.

FIG. 18 is a cross-sectional view illustrating a semiconductor device according to an exemplary embodiment of the present disclosure. FIG. 19 is an enlarged view of region R7 of FIG. 18.

Figure 19:
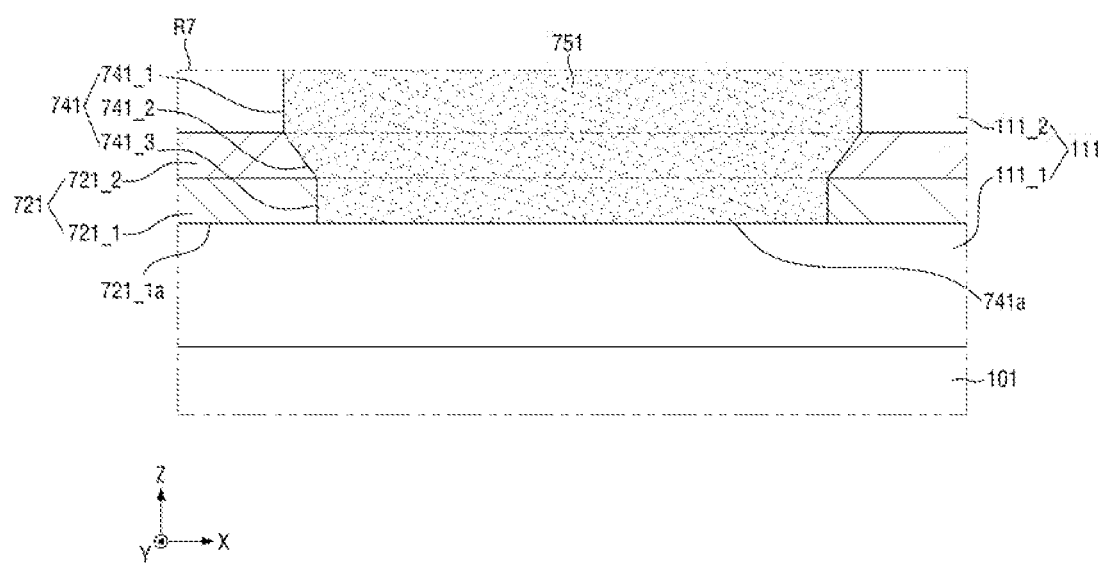
FIG. 19 is an enlarged view of region R7 of FIG. 18.

Referring to FIGS. 18 and 19, in a semiconductor device according to an exemplary embodiment of the present disclosure, the bottom surfaces of first to third recesses 741, 742 and 743 may be formed on a plane the same as that of the bottom surfaces of first to third etch stop layers 721, 722 and 723, respectively.

A bottom surface 741a of the first recess 741 may be formed on a plane the same as that of a bottom surface 721_1a of a first layer 721_1 of the first etch stop layer 721. The bottom surface of the second recess 742 may be formed on a plane the same as that of the bottom surface of a first layer 722_1 of the second etch stop layer 722. The bottom surface of the third recess 743 may be formed on a plane the same as that of the bottom surface of a first layer 723_1 of the third etch stop layer 723.

The first recess 741 may include a first portion 741_1 formed inside the first upper channel layer 111_2, a second portion 741_2 formed inside a second layer 721_2 of the first etch stop layer 721, and a third portion 741_3 formed inside the first layer 721_1 of the first etch stop layer 721.

An inclined profile of the sidewall of the second portion 741_2 of the first recess 741 may be different from each of an inclined profile of the sidewall of the first portion 741_1 of the first recess 741 and an inclined profile of the sidewall of the third portion 741_3 of the first recess 741. That is, the inclined profile of the sidewall of the first recess 741 may have an inflection point at an interface between the first upper channel layer 111_2 and the second layer 721_2 of the first etch stop layer 721. In addition, the inclined profile of the sidewall of the first recess 741 may have an inflection point at an interface between the second layer 721_2 of the first etch stop layer 721 and the first layer 721_1 of the first etch stop layer 721. In an exemplary embodiment of the present disclosure, the first portion 741_1 of the first recess 741 and the third portion 741_3 of the first recess 741 may each have a nearly vertical or slightly sloped sidewall profile, while the second portion 741_2 of the first recess 741 may have a sloped sidewall profile. For example, the first upper channel layer 111_2 and the first layer 721_1 of the first etch stop layer 721 may each have an etching selectivity (or an etch rate) higher than that of the second layer 721_2 of the first etch stop layer 721 during the etching process of forming the first recess 741.

Each of the second recess 742 and the third recess 743 may have a structure which is the same as or similar to that of the first recess 741.

A first source/drain region 751 may be in contact with the top surface of the first lower channel layer 111_1. A second source/drain region 752 may be in contact with the top surface of the second lower channel layer 112_1. A third source/drain region 753 may be in contact with the top surface of the third lower channel layer 113_1. In the present exemplary embodiment, the first to third etch stop layers 721, 722 and 723 may provide a uniform depth for the first to third source/drain regions 751, 752 and 753 to reduce variations.

Hereinafter, a semiconductor device according to an exemplary embodiment of the present disclosure will be described with reference to FIGS. 20 and 21. Differences from the semiconductor device shown in FIGS. 2 to 7 will be mainly described.

Figure 20:
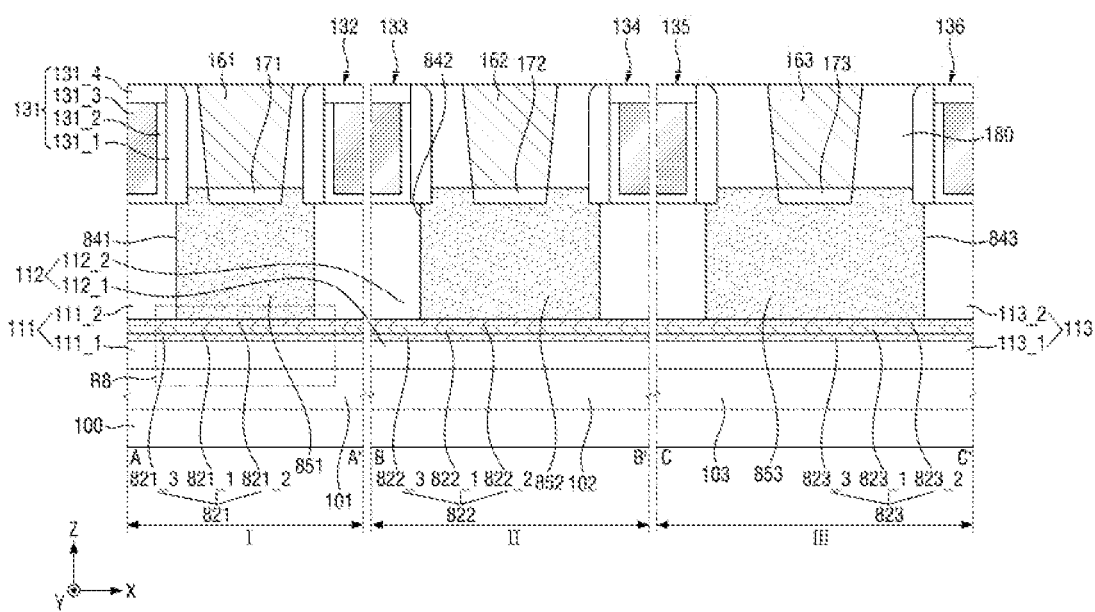
FIG. 20 is a cross-sectional view illustrating a semiconductor device according to an exemplary embodiment of the present disclosure.

FIG. 20 is a cross-sectional view illustrating a semiconductor device according to an exemplary embodiment of the present disclosure. FIG. 21 is an enlarged view of region R8 of FIG. 20.

Figure 21:
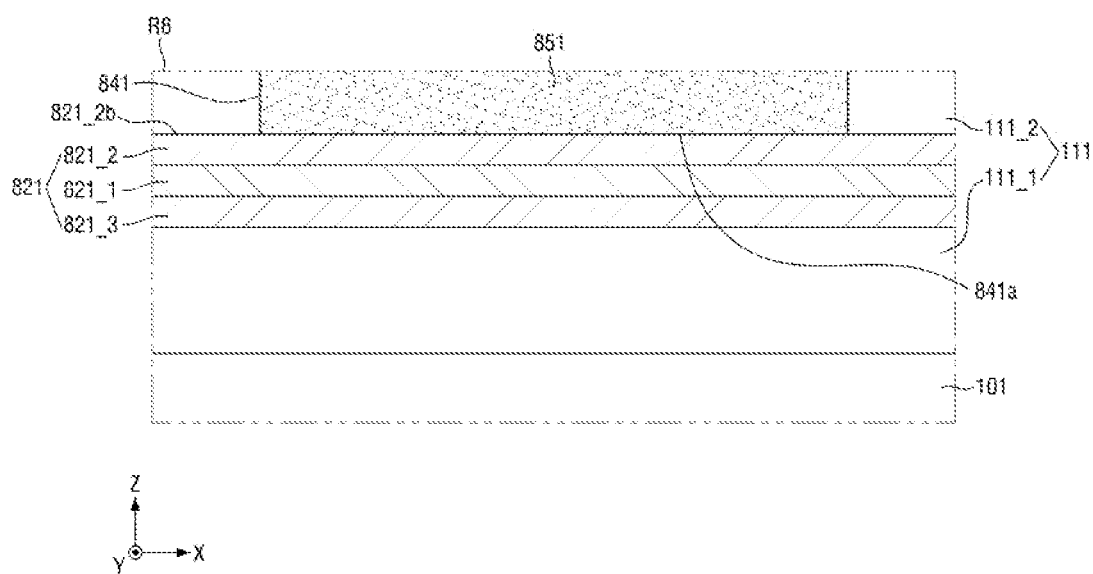
FIG. 21 is an enlarged view of region R8 of FIG. 20.

Referring to FIGS. 20 and 21, in a semiconductor device according to an exemplary embodiment of the present disclosure, the bottom surfaces of first to third recesses 841, 842 and 843 may be formed on a plane the same as that of the top surfaces of first to third etch stop layers 821, 822 and 823, respectively.

The first etch stop layer 821 may include a third layer 821_3 disposed on the first lower channel layer 111_1, a first layer 821_1 disposed on the third layer 821_3, and a second layer 821_2 disposed on the first layer 821_1. The second etch stop layer 822 may include a third layer 822_3 disposed on the second lower channel layer 112_1, a first layer 822_1 disposed on the third layer 822_3, and a second layer 822_2 disposed on the first layer 822_1. The third etch stop layer 823 may include a third layer 823_3 disposed on the third lower channel layer 113_1, a first layer 823_1 disposed on the third layer 823_3, and a second layer 823_2 disposed on the first layer 823_1.

Similar to the first to third channel layers 111, 112 and 113, each of the first layer 821_1 of the first etch stop layer 821, the first layer 822_1 of the second etch stop layer 822, and the first layer 823_1 of the third etch stop layer 823 may include, for example, silicon germanium (SiGe).

The first channel layer 111 may include germanium (Ge) at a first concentration, and the first layer 821_1 of the first etch stop layer 821 may include germanium (Ge) at a second concentration smaller than the first concentration. The second channel layer 112 may include germanium (Ge) at a third concentration, and the first layer 822_1 of the second etch stop layer 822 may include germanium (Ge) at a fourth concentration smaller than the third concentration. The third channel layer 113 may include germanium (Ge) at a fifth concentration, and the first layer 823_1 of the third etch stop layer 823 may include germanium (Ge) at a sixth concentration smaller than the fifth concentration.

Each of the second layer 821_2 of the first etch stop layer 821, the third layer 821_3 of the first etch stop layer 821, the second layer 822_2 of the second etch stop layer 822, the third layer 822_3 of the second etch stop layer 822, the second layer 823_2 of the third etch stop layer 823, and the third layer 823_3 of the third etch stop layer 823 may include, for example, silicon (Si).

A first source/drain region 851 may be in contact with a top surface 821_2b of the second layer 821_2 of the first etch stop layer 821, a second source/drain region 852 may be in contact with the top surface of the second layer 822_2 of the second etch stop layer 822, and a third source/drain region 853 may be in contact with the top surface of the second layer 823_2 of the third etch stop layer 823. In the present exemplary embodiment, the second layer 821_2 of the first etch stop layer 821, the second layer 822_2 of the second etch stop layer 822, the second layer 823_2 of the third etch stop layer 823 may provide a uniform depth for the first to third source/drain regions 851, 852 and 853 to reduce variations.

The first to third etch stop layers respectively disposed inside the first to third channel layers may each include silicon (Si), silicon germanium (SiGe), or both silicon (Si) and silicon germanium (SiGe). For example, the first to third etch stop layers 121, 122 and 123 respectively disposed inside the first to third channel layers 111, 112 and 113 as shown in FIGS. 2 and 8 may each include silicon (Si) or silicon germanium (SiGe). For example, the first to third etch stop layers 821, 822 and 823 respectively disposed inside the first to third channel layers 111, 112 and 113 as shown in FIG. 20 may each include both silicon (Si) and silicon germanium (SiGe).

Hereinafter, a semiconductor device according to an exemplary embodiment of the present disclosure will be described with reference to FIGS. 22 and 23. Differences from the semiconductor device shown in FIGS. 20 and 21 will be mainly described.

Figure 22:
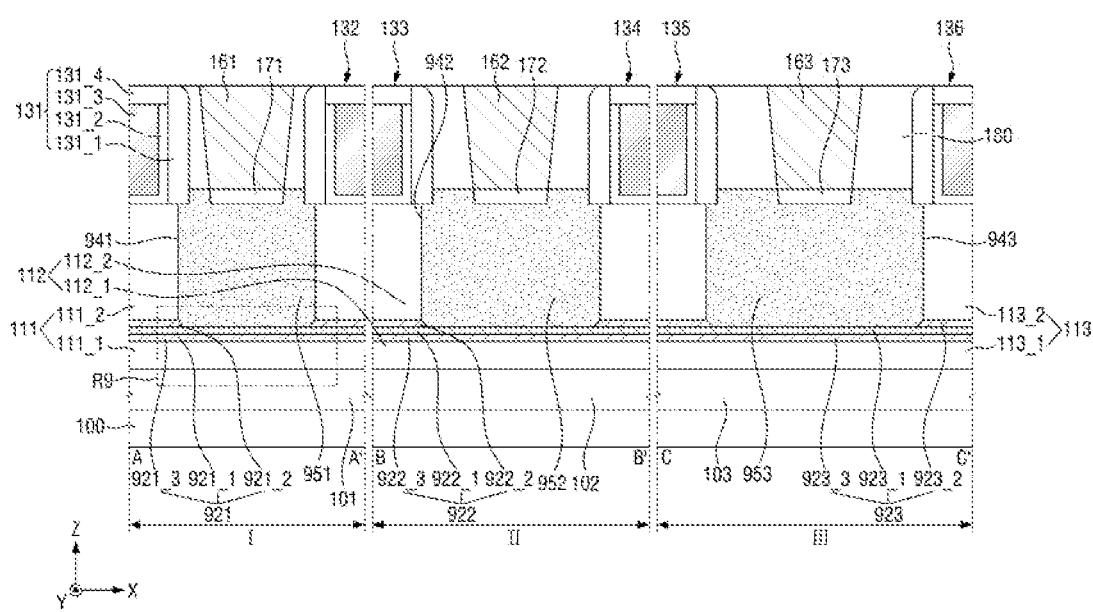
FIG. 22 is a cross-sectional view illustrating a semiconductor device according to an exemplary embodiment of the present disclosure.

FIG. 22 is a cross-sectional view illustrating a semiconductor device according to an exemplary embodiment of the present disclosure. FIG. 23 is an enlarged view of region R9 of FIG. 22.

Figure 23:
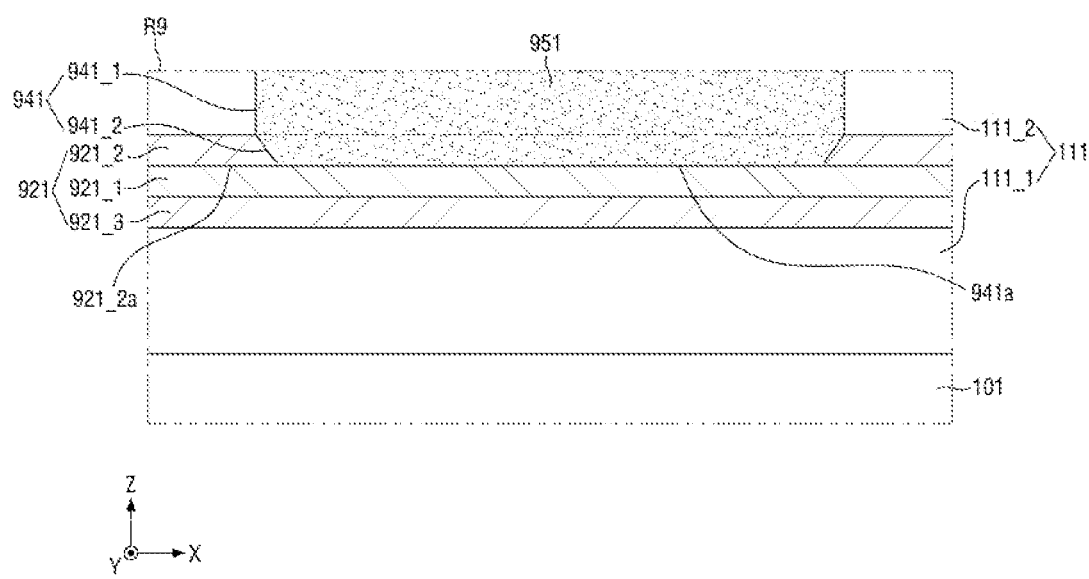
FIG. 23 is an enlarged view of region R9 of FIG. 22.

Referring to FIGS. 22 and 23, in a semiconductor device according to an exemplary embodiment of the present disclosure, the bottom surfaces of first to third recesses 941, 942 and 943 may be formed inside first to third etch stop layers 921, 922 and 923, respectively.

A bottom surface 941a of the first recess 941 may be formed on a plane the same as that of a bottom surface 921_2a of a second layer 921_2 of the first etch stop layer 921. The bottom surface of the second recess 942 may be formed on a plane the same as that of the bottom surface of a second layer 922_2 of the second etch stop layer 922. The bottom surface of the third recess 943 may be formed on a plane the same as that of the bottom surface of a second layer 923_2 of the third etch stop layer 923.

The first recess 941 may include a first portion 941_1 formed inside the first upper channel layer 111_2 and a second portion 941_2 formed inside a second layer 921_2 of the first etch stop layer 921.

An inclined profile of the sidewall of the second portion 941_2 of the first recess 941 may be different from an inclined profile of the sidewall of the first portion 941_1 of the first recess 941. That is, the inclined profile of the sidewall of the first recess 941 may have an inflection point at an interface between the first upper channel layer 111_2 and the first etch stop layer 921. In an exemplary embodiment of the present disclosure, the first portion 941_1 of the first recess 941 may have a nearly vertical or slightly sloped sidewall profile, while the second portion 941_2 of the first recess 941 may have a sloped sidewall profile. For example, the first upper channel layer 111_2 may have an etching selectivity (or an etch rate) higher than that of the first etch stop layer 921 during the etching process of forming the first recess 941.

Each of the second recess 942 and the third recess 943 may have a structure which is the same as or similar to that of the first recess 941.

A first source/drain region 951 may be in contact with the top surface of a first layer 921_1 of the first etch stop layer 921. A second source/drain region 952 may be in contact with the top surface of a first layer 922_1 of the second etch stop layer 922. A third source/drain region 953 may be in contact with the top surface of a first layer 923_1 of the third etch stop layer 923. In the present exemplary embodiment, the first to third etch stop layers 921, 922 and 923 may provide a uniform depth for the first to third source/drain regions 951, 952 and 953 to reduce variations.

Hereinafter, a semiconductor device according to an exemplary embodiment of the present disclosure will be described with reference to FIGS. 24 and 25. Differences from the semiconductor device shown in FIGS. 20 and 21 will be mainly described.

Figure 24:
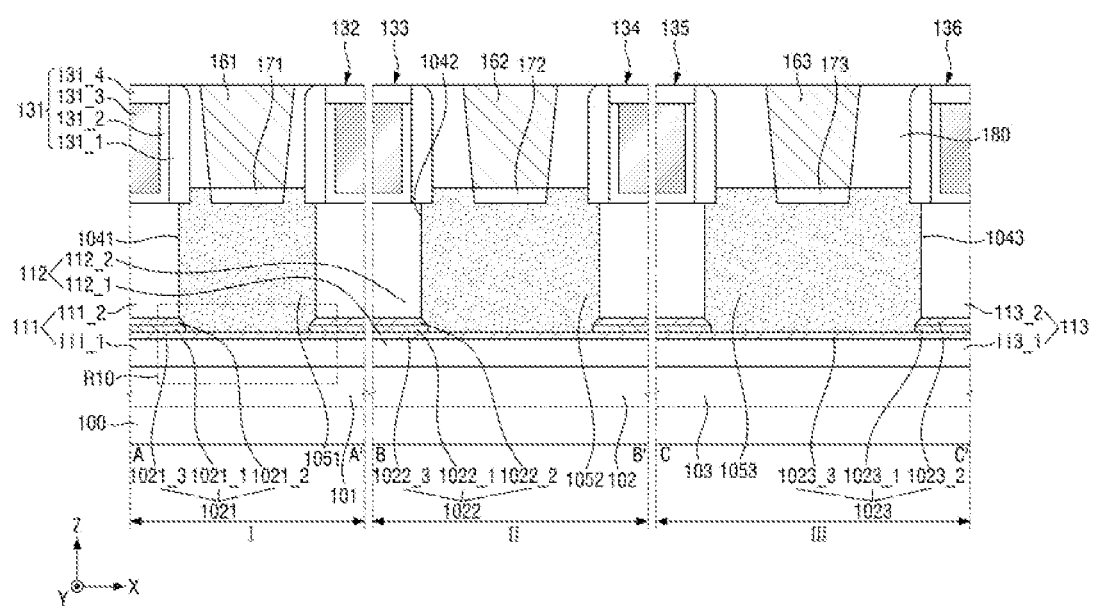
FIG. 24 is a cross-sectional view illustrating a semiconductor device according to an exemplary embodiment of the present disclosure.

FIG. 24 is a cross-sectional view illustrating a semiconductor device according to an exemplary embodiment of the present disclosure. FIG. 25 is an enlarged view of region R10 of FIG. 24.

Figure 25:
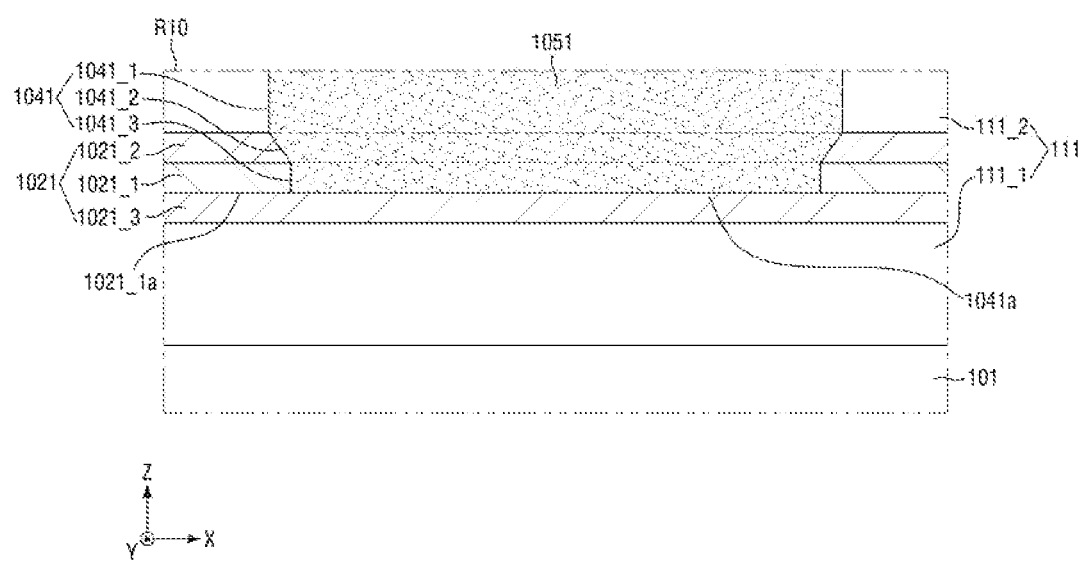
FIG. 25 is an enlarged view of region R10 of FIG. 24.

Referring to FIGS. 24 and 25, in a semiconductor device according to an exemplary embodiment of the present disclosure, the bottom surfaces of first to third recesses 1041, 1042 and 1043 may be formed inside the first to third etch stop layers 1021, 1022 and 1023, respectively.

A bottom surface 1041a of the first recess 1041 may be formed on a plane the same as that of a bottom surface 1021_1a of a first layer 1021_1 of the first etch stop layer 1021. The bottom surface of the second recess 1042 may be formed on a plane the same as that of the bottom surface of a first layer 1022_1 of the second etch stop layer 1022. The bottom surface of the third recess 1043 may be formed on a plane the same as that of the bottom surface of a first layer 1023_1 of the third etch stop layer 1023.

The first recess 1041 may include a first portion 1041_1 formed inside the first upper channel layer 111_2, a second portion 1041_2 formed inside a second layer 1021_2 of the first etch stop layer 1021, and a third portion 1041_3 formed inside the first layer 1021_1 of the first etch stop layer 1021.

An inclined profile of the sidewall of the second portion 1041_2 of the first recess 1041 may be different from each of an inclined profile of the sidewall of the first portion 1041_1 of the first recess 1041 and an inclined profile of the sidewall of the third portion 1041_3 of the first recess 1041. That is, the inclined profile of the sidewall of the first recess 1041 may have an inflection point at an interface between the first upper channel layer 111_2 and the second layer 1021_2 of the first etch stop layer 1021. In addition, the inclined profile of the sidewall of the first recess 1041 may have an inflection point at an interface between the second layer 1021_2 of the first etch stop layer 1021 and the first layer 1021_1 of the first etch stop layer 1021. In an exemplary embodiment of the present disclosure, the first portion 1041_1 of the first recess 1041 and the third portion 1041_3 of the first recess 1041 may each have a nearly vertical or slightly sloped sidewall profile, while the second portion 1041_2 of the first recess 1041 may have a sloped sidewall profile. For example, the first upper channel layer 111_2 and the first layer 1021_1 of the first etch stop layer 1021 may each have an etching selectivity (or an etch rate) higher than that of the second layer 1021_2 of the first etch stop layer 1021 during the etching process of forming the first recess 1041.

Each of the second recess 1042 and the third recess 1043 may have a structure which is the same as or similar to that of the first recess 1041.

A first source/drain region 1051 may be in contact with the top surface of a third layer 1021_3 of the first etch stop layer 1021. A second source/drain region 1052 may be in contact with the top surface of a third layer 1022_3 of the second etch stop layer 1022. A third source/drain region 1053 may be in contact with the top surface of a third layer 1023_3 of the third etch stop layer 1023. In the present exemplary embodiment, the first to third etch stop layers 1021, 1022 and 1023 may provide a uniform depth for the first to third source/drain regions 1051, 1052 and 1053 to reduce variations.

Hereinafter, a semiconductor device according to an exemplary embodiment of the present disclosure will be described with reference to FIGS. 26 and 27. Differences from the semiconductor device shown in FIGS. 20 and 21 will be mainly described.

Figure 26:
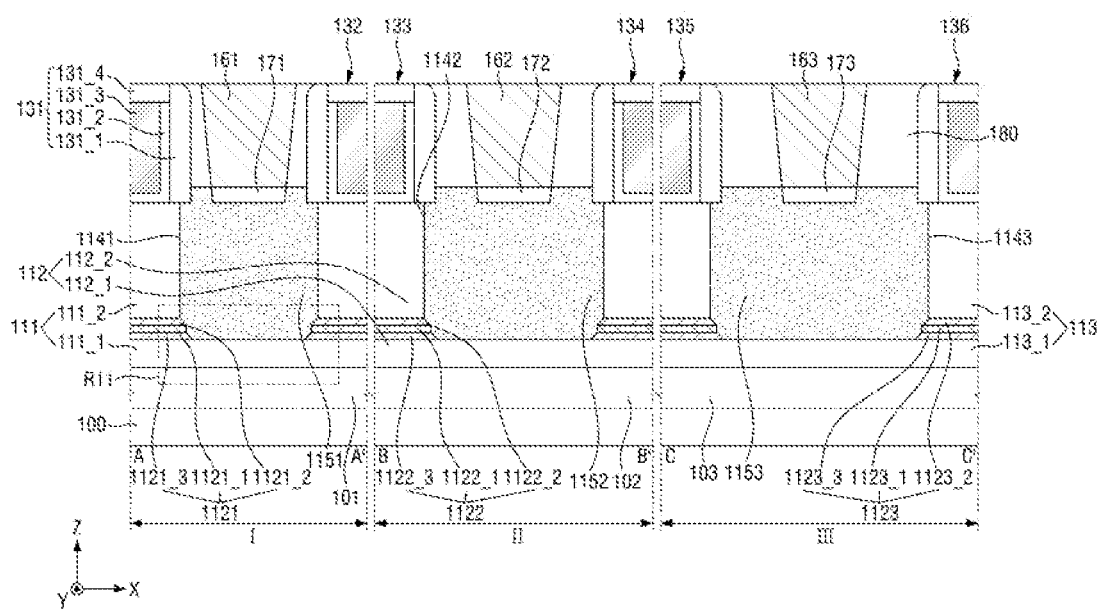
FIG. 26 is a cross-sectional view illustrating a semiconductor device according to an exemplary embodiment of the present disclosure.

FIG. 26 is a cross-sectional view illustrating a semiconductor device according to an exemplary embodiment of the present disclosure. FIG. 27 is an enlarged view of region R11 of FIG. 26.

Figure 27:
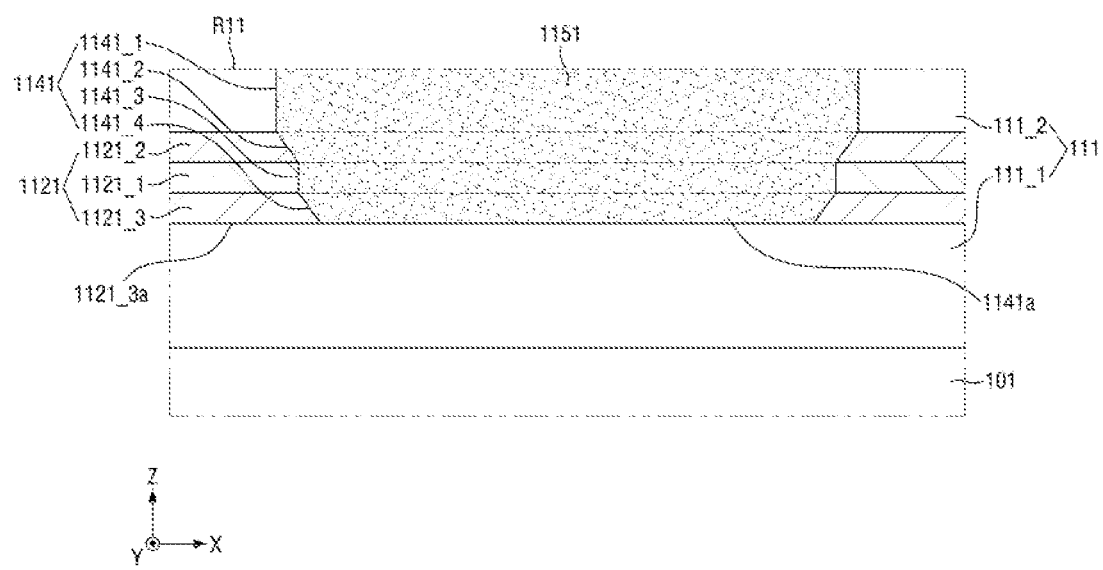
FIG. 27 is an enlarged view of region R11 of FIG. 26.

Referring to FIGS. 26 and 27, in a semiconductor device according to an exemplary embodiment of the present disclosure, the bottom surfaces of first to third recesses 1141, 1142 and 1143 may be formed on a plane the same as that of the bottom surfaces of first to third etch stop layers 1121, 1122 and 1123, respectively.

A bottom surface 1041a of the first recess 1041 may be formed on a plane the same as that of a bottom surface 1121_3a of a third layer 1121_3 of the first etch stop layer 1121. The bottom surface of the second recess 1142 may be formed on a plane the same as that of the bottom surface of a third layer 1122_3 of the second etch stop layer 1122. The bottom surface of the third recess 1143 may be formed on a plane the same as that of the bottom surface of a third layer 1123_3 of the third etch stop layer 1123.

The first recess 1141 may include a first portion 1141_1 formed inside the first upper channel layer 111_2, a second portion 1141 2 formed inside a second layer 1121 2 of the first etch stop layer 1121, a third portion 1141_3 formed inside the first layer 1121_1 of the first etch stop layer 1121, and a fourth portion 1141_4 formed inside the third layer 1121_3 of the first etch stop layer 1121.

An inclined profile of the sidewall of the second portion 1141_2 of the first recess 1141 may be different from each of an inclined profile of the sidewall of the first portion 1141_1 of the first recess 1141 and an inclined profile of the sidewall of the third portion 1141_3 of the first recess 1141. Further, an inclined profile of the sidewall of the fourth portion 1141_4 of the first recess 1141 may be different from each of an inclined profile of the sidewall of the first portion 1141_1 of the first recess 1141 and an inclined profile of the sidewall of the third portion 1141_3 of the first recess 1141.

The inclined profile of the sidewall of the first recess 1141 may have an inflection point at an interface between the first upper channel layer 111_2 and the second layer 1121_2 of the first etch stop layer 1121. In addition, the inclined profile of the sidewall of the first recess 1141 may have an inflection point at an interface between the second layer 1121_2 of the first etch stop layer 1121 and the first layer 1121_1 of the first etch stop layer 1121. Further, the inclined profile of the sidewall of the first recess 1141 may have an inflection point at an interface between the first layer 1121_1 of the first etch stop layer 1121 and the third layer 1121_3 of the first etch stop layer 1121. In an exemplary embodiment of the present disclosure, the first portion 1141_1 of the first recess 1141 and the third portion 1141_3 of the first recess 1141 may each have a nearly vertical or slightly sloped sidewall profile, while the second portion 1141 2 of the first recess 1141 and the fourth portion 1141_4 of the first recess 1141 may have a sloped sidewall profile. For example, the first upper channel layer 111_2 and the first layer 1121_1 of the first etch stop layer 1121 may each have an etching selectivity (or an etch rate) higher than that of the second layer 1121_2 of the first etch stop layer 1121 and the third layer 1121_3 of the first etch stop layer 1121 during the etching process of forming the first recess 1141.

Each of the second recess 1142 and the third recess 1143 may have a structure which is the same as or similar to that of the first recess 1141.

A first source/drain region 1151 may be in contact with the top surface of the first lower channel layer 111_1. A second source/drain region 1152 may be in contact with the top surface of the second lower channel layer 112_1. A third source/drain region 1153 may be in contact with the top surface of the third lower channel layer 113_1. In the present exemplary embodiment, the first to third etch stop layers 1121, 1122 and 1123 may provide a uniform depth for the first to third source/drain regions 1151, 1152 and 1153 to reduce variations.

Hereinafter, a semiconductor device according to an exemplary embodiment of the present disclosure will be described with reference to FIGS. 28 to 30. Differences from the semiconductor device shown in FIGS. 2 to 7 will be mainly described.

Figure 28:
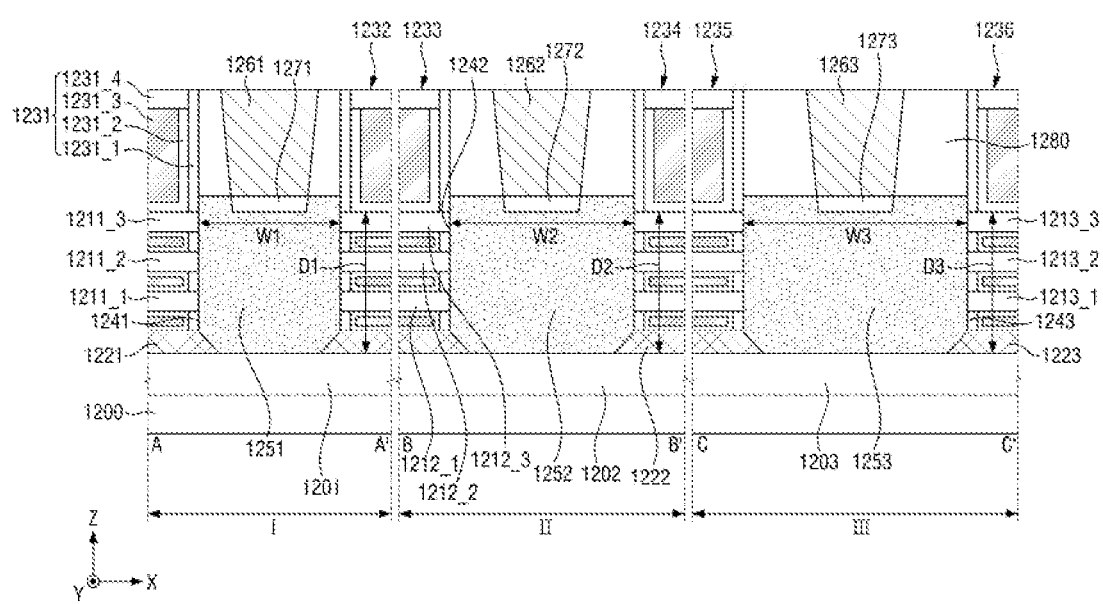
FIGS. 28 to 30 are cross-sectional views illustrating a semiconductor device according to an exemplary embodiment of the present disclosure.
Figure 29:
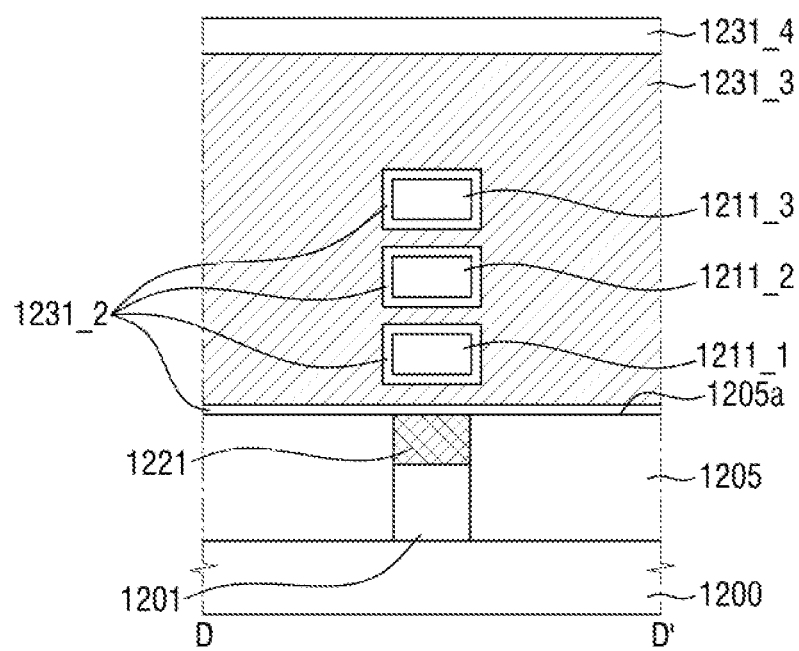
Figure 30:
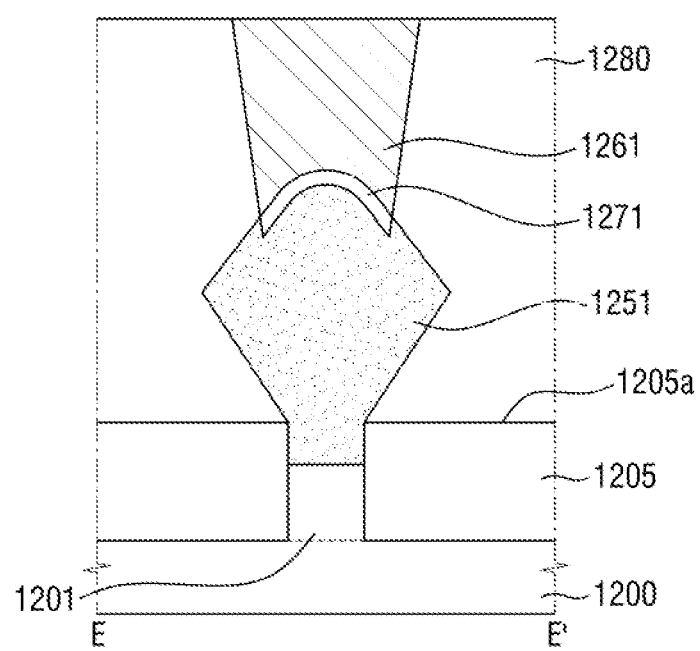

FIGS. 28 to 30 are cross-sectional views illustrating a semiconductor device according to an exemplary embodiment of the present disclosure.

Referring to FIGS. 28 to 30, a semiconductor device according to an exemplary embodiment of the present disclosure includes a substrate 1200, first to third fin-shaped patterns 1201, 1202 and 1203, a field insulating layer 1205, first to ninth nanowires 1211_1, 1211_2, 1211_3, 1212_1, 1212_2, 1212_3, 1213_1, 1213_2 and 1213_3, first to third etch stop layers 1221, 1222 and 1223, first to sixth gate structures 1231, 1232, 1233, 1234, 1235 and 1236, first to third recesses 1241, 1242 and 1243, first to third source/drain regions 1251, 1252 and 1253, first to third contacts 1261, 1262 and 1263, first to third silicide layers 1271, 1272 and 1273, and an interlayer insulating layer 1280.

The first to third nanowires 1211_1, 1211_2 and 1211_3 may be spaced apart sequentially in the third direction Z on the first fin-shaped pattern 1201. The fourth to sixth nanowires 1212_1, 1212_2 and 1212_3 may be spaced apart sequentially in the third direction Z on the second fin-shaped pattern 1202. The seventh to ninth nanowires 1213_1, 1213_2 and 1213_3 may be spaced apart sequentially in the third direction Z on the third fin-shaped pattern 1203. Each of the first to ninth nanowires 1211_1, 1211_2, 1211_3, 1212_1, 1212_2, 1212 3, 1213_1, 1213_2 and 1213_3 may extend in the first direction X, and may include silicon germanium (SiGe). In an exemplary embodiment of the present disclosure, each of the first to ninth nanowires 1211_1, 1211_2, 1211_3, 1212_1, 1212_2, 1212_3, 1213_1, 1213_2 and 1213_3 may serve as a channel of a transistor, which may be referred to as the channel. In an exemplary embodiment of the present disclosure, each of the first to third etch stop layers 1221, 1222 and 1223 may include silicon germanium (SiGe) which has a germanium (Ge) concentration smaller than that of the silicon germanium (SiGe) included in each of the first to ninth nanowires 1211_1, 1211_2, 1211_3, 1212_1, 1212_2, 1212_3, 1213_1, 1213_2 and 1213_3. In an exemplary embodiment of the present disclosure, each of the first to third etch stop layers 1221, 1222 and 1223 may include silicon (Si).

The first to third nanowires 1211_1, 1211_2 and 1211_ may be in contact with the first source/drain region 1251.

The first gate structure 1231 and the second gate structure 1232 may extend in the second direction Y on a first region I of the substrate 1200, and may cross the first fin-shaped pattern 1201. The first gate structure 1231 may be spaced apart from the second gate structure 1232 in the first direction X.

The third gate structure 1233 and the fourth gate structure 1234 may extend in the second direction Y on a second region II of the substrate 1200, and may cross the second fin-shaped pattern 1202. The third gate structure 1233 may be spaced apart from the fourth gate structure 1234 in the first direction X.

The fifth gate structure 1235 and the sixth gate structure 1236 may extend in the second direction Y on a third region III of the substrate 1200, and may cross the third fin-shaped pattern 1203. The fifth gate structure 1235 may be spaced apart from the sixth gate structure 1236 in the first direction X.

The first gate structure 1231 may surround the first to third nanowires 1211_1, 1211_2 and 1211_3. The first gate structure 1231 may include gate spacers 1231_1, a gate insulating layer 1231_2, a gate electrode 1231_3, and a capping pattern 1231_4.

The gate electrode 1231_3 may extend in the second direction Y on the first region I of the substrate 1200. The gate electrode 1231_3 may surround the first to third nanowires 121_1, 1211_2 and 1211_3.

The gate spacer 1231_1 may be disposed on at least one sidewall of the gate electrode 1231_3. The gate spacer 1231_1 may extend in the second direction Y along the sidewall of the gate electrode 1231_3.

The gate insulating layer 1231_2 may be disposed between the gate electrode 1231_3 and the gate spacer 1231_1, between the gate electrode 1231_3 and the first etch stop layer 1221, between the gate electrode 1231_3 and the first nanowire 1211_1, between the gate electrode 1231_3 and the second nanowire 1211_2, and between the gate electrode 1231_3 and the third nanowire 1211_3. Also, the gate insulating layer 1231_2 may be disposed between the gate electrode 1231_3 and the field insulating layer 1205.

The capping pattern 1231 4 may be disposed between the gate spacers 1231_1 on the gate electrode 1231_3. Although FIG. 28 illustrates that the gate insulating layer 1231_2 does not extend between the gate spacer 1231_1 and the capping pattern 1231_4, the present disclosure is not limited thereto.

Each of the second to sixth gate structures 1232, 1233, 1234, 1235 and 1236 may have a structure the same as that of the first gate structure 1231. In the present exemplary embodiment, the first to third etch stop layers 1221, 1222 and 1223 may provide a uniform depth for the first to third source/drain regions 1251, 1252 and 1253 to reduce variations.

In concluding the detailed description, those skilled in the art will appreciate that many variations and modifications can be made to the preferred exemplary embodiments without departing from the spirit and scope of the present disclosure. Therefore, the disclosed preferred exemplary embodiments of the present disclosure are used in a generic and descriptive sense only and not for purposes of limitation.

What is claimed is:

1. A semiconductor device comprising:
   first and second fin-shaped patterns disposed on a substrate and extending in a first direction;
   a first channel layer disposed on the first fin-shaped pattern;
   a second channel layer disposed on the second fin-shaped pattern;

a first etch stop layer disposed inside the first channel layer;

a second etch stop layer disposed inside the second channel layer;

first and second gate structures extending in a second direction different from the first direction on the first channel layer;

third and fourth gate structures extending in the second direction on the second channel layer;

a first recess formed between the first gate structure and the second gate structure, the first recess having a first width in the first direction and having a first depth in a third direction perpendicular to the first and second directions;

a second recess formed between the third gate structure and the fourth gate structure, the second recess having a second width in the first direction and having a second depth in the third direction; and a field insulating layer disposed on a sidewall of the first channel layer on the substrate, wherein the second width is different from the first width, the second depth is equal to the first depth, and a top surface of the first etch stop layer is higher than a top surface of the field insulating layer.

2. The semiconductor device of claim 1, wherein the first channel layer includes silicon germanium (SiGe), and the first etch stop layer includes silicon (Si).

3. The semiconductor device of claim 1, wherein each of the first channel layer and the first etch stop layer includes silicon germanium (SiGe), the first channel layer includes germanium (Ge) at a first concentration, and the first etch stop layer includes germanium (Ge) at a second concentration smaller than the first concentration.

4. The semiconductor device of claim 1, wherein the first etch stop layer comprises a first layer disposed on the substrate and including silicon germanium (SiGe), and a second layer disposed on the first layer and including silicon (Si).

5. The semiconductor device of claim 4, wherein the first etch stop layer further comprises a third layer disposed between the substrate and the first layer, with the third layer including silicon (Si).

6. The semiconductor device of claim 4, wherein the first recess comprises:

a first portion formed inside the first channel layer;
a second portion formed inside the second layer; and
a third portion formed inside the first layer,
wherein an inclined profile of a sidewall of the second portion is different from an inclined profile of a sidewall of the first portion and an inclined profile of a sidewall of the third portion.

7. The semiconductor device of claim 1, wherein a bottom surface of the first recess is formed on a plane the same as that of a bottom surface of the first etch stop layer.

8. The semiconductor device of claim 7, wherein the first recess comprises:

a first portion formed inside the first channel layer; and
a second portion formed inside the first etch stop layer,
wherein an inclined profile of a sidewall of the first portion is different from an inclined profile of a sidewall of the second portion.

9. The semiconductor device of claim 1, wherein a bottom surface of the first recess is formed on a plane the same as that of the top surface of the first etch stop layer.

10. The semiconductor device of claim 1, wherein a bottom surface of the first recess is formed inside the first etch stop layer.

11. The semiconductor device of claim 1, wherein the first channel layer comprises an upper channel layer disposed above the first etch stop layer and a lower channel layer disposed below the first etch stop layer, and a bottom surface of the first recess is formed inside the lower channel layer.

12. The semiconductor device of claim 1, further comprising:

a third fin-shaped pattern disposed on the substrate and extending in the first direction;

a third channel layer disposed on the third fin-shaped pattern;

a third etch stop layer disposed inside the third channel layer;

fifth and sixth gate structures extending in the second direction on the third channel layer; and a third recess formed between the fifth gate structure and the sixth gate structure, the third recess having a third width in the first direction and having a third depth in the third direction, wherein the third width is different from the first width and the second width, and the third depth is equal to the first depth.

13. The semiconductor device of claim 1, wherein a thickness of the first etch stop layer in the third direction ranges from about 2 nm to about 10 nm.

14. A semiconductor device comprising:

a substrate comprising a first PMOS region and a second PMOS region;

a first fin-shaped pattern disposed on the first PMOS region and extending in a first direction;

a second fin-shaped pattern disposed on the second PMOS region and extending in the first direction;

a first gate structure disposed on the first fin-shaped pattern and extending in a second direction different from the first direction;

a second gate structure disposed on the second fin-shaped pattern and extending in the second direction;

a first recess formed on at least one side of the first gate structure, the first recess having a first width in the first direction and having a first depth in a third direction perpendicular to the first and second directions;

a second recess formed on at least one side of the second gate structure, the second recess having a second width in the first direction, and having a second depth in the third direction;

a first channel layer disposed between the first fin-shaped pattern and the first gate structure;

a field insulating layer disposed on a sidewall of the first channel layer on the substrate; and a first etch stop layer disposed inside the first channel layer, wherein the second width is different from the first width, the second depth is equal to the first depth, and a top surface of the first etch stop layer is higher than a top surface of the field insulating layer.

15. The semiconductor device of claim 14, further comprising:

a second channel layer disposed between the second fin-shaped pattern and the second gate structure; and a second etch stop layer disposed inside the second channel layer.

16. The semiconductor device of claim 15, wherein each of the first and second channel layers includes silicon germanium (SiGe), and each of the first and second etch stop layers includes silicon (Si).

17. The semiconductor device of claim 15, wherein each of the first and second channel layers and the first and second etch stop layers includes silicon germanium (SiGe), the first channel layer includes germanium (Ge) at a first concentration, and the second channel layer includes germanium (Ge) at a second concentration, and the first etch stop layer includes germanium (Ge) at a third concentration smaller than the first concentration, and the second etch stop layer includes germanium (Ge) at a fourth concentration smaller than the second concentration.

18. A semiconductor device comprising:

a substrate comprising a first PMOS region and a second PMOS region;

a first fin-shaped pattern disposed on the first PMOS region and extending in a first direction;

a second fin-shaped pattern disposed on the second PMOS region and extending in the first direction;

a first channel layer disposed on the first fin-shaped pattern and including silicon germanium (SiGe);

a second channel layer disposed on the second fin-shaped pattern and including silicon germanium (SiGe);

a first etch stop layer disposed inside the first channel layer and including silicon (Si), silicon germanium (SiGe), or both silicon (Si) and silicon germanium (SiGe);

a second etch stop layer disposed inside the second channel layer and including silicon (Si), silicon germanium (SiGe), or both silicon (Si) and silicon germanium (SiGe);

first and second gate structures extending in a second direction different from the first direction on the first channel layer;

third and fourth gate structures extending in the second direction on the second channel layer;

a first recess formed between the first gate structure and the second gate structure, the first recess having a first width in the first direction and having a first depth in a third direction perpendicular to the first and second directions;

a second recess formed between the third gate structure and the fourth gate structure, the second recess having a second width in the first direction and having a second depth in the third direction;

a first source/drain region disposed inside the first recess;

a second source/drain region disposed inside the second recess; and a field insulating layer disposed on a sidewall of the first channel layer on the substrate, wherein the second width is different from the first width, the second depth is equal to the first depth, and a top surface of the first etch stop layer is higher than a top surface of the field insulating layer.

19. The semiconductor device of claim 18, wherein the first channel layer includes germanium (Ge) at a first concentration, and the second channel layer includes germanium (Ge) at a second concentration, and the first etch stop layer includes germanium (Ge) at a third concentration smaller than the first concentration, and the second etch stop layer includes germanium (Ge) at a fourth concentration smaller than the second concentration.

* * * * *